United States Patent [19]
Owens

[11] Patent Number: 5,612,552
[45] Date of Patent: Mar. 18, 1997

[54] MULTILEVEL GATE ARRAY INTEGRATED CIRCUIT STRUCTURE WITH PERPENDICULAR ACCESS TO ALL ACTIVE DEVICE REGIONS

[75] Inventor: Alexander H. Owens, Los Gatos, Calif.

[73] Assignee: LSI Logic Corporation, Milpitas, Calif.

[21] Appl. No.: 408,035

[22] Filed: Mar. 21, 1995

Related U.S. Application Data

[63] Continuation-in-part of Ser. No. 220,732, Mar. 31, 1994, abandoned.
[51] Int. Cl.$^6$ .............. H01L 27/10; H01L 29/76; H01L 29/04; H01L 27/01
[52] U.S. Cl. .............. 257/202; 257/67; 257/74; 257/211; 257/347; 257/350; 257/278
[58] Field of Search .............. 257/202, 67, 69, 257/74, 203, 204, 206, 211, 369, 347, 350, 351, 278

[56] References Cited

U.S. PATENT DOCUMENTS

| | | | |
|---|---|---|---|
| 4,487,635 | 12/1984 | Kugimiya et al. | 148/1.5 |
| 4,489,478 | 12/1984 | Sakurai | 29/574 |
| 4,554,572 | 11/1985 | Chatterjee | 357/42 |
| 4,630,089 | 12/1986 | Sasaki et al. | 357/23.7 |
| 4,679,299 | 7/1987 | Szluk et al. | 29/571 |
| 5,006,913 | 4/1991 | Sugahara et al. | 357/41 |

FOREIGN PATENT DOCUMENTS

| 4-3457 | 1/1992 | Japan | 257/202 |
|---|---|---|---|

OTHER PUBLICATIONS

Wolf, Stanley, *Silicon Processing for the VLSI Era*, vol. 1: *Process Technology*, Sunset Beach, CA: Lattice Press, 1986, pp. 124–197.

*Primary Examiner*—Steven H. Loke
*Attorney, Agent, or Firm*—John P. Taylor

[57] ABSTRACT

A multilevel gate array MOS-type integrated circuit structure is described wherein each source, drain, and gate electrode region in the integrated circuit structure is accessible directly through a contact opening formed normal to the plane of the underlying substrate through an overlying insulation layer. The multilevel gate array MOS-type integrated circuit structure of the invention comprises a substrate; a first semiconductor device level comprising one or more first source regions, one or more first drain regions, and one or more first gate electrode regions; and a second semiconductor device level formed over the first semiconductor device level and comprising one or more second source regions arranged to permit access, normal to the plane of the underlying substrate, to an underlying first source region in the first level, one or more second drain regions arranged to permit access, normal to the plane of the underlying substrate, to an underlying drain region in the first level, and one or more second gate electrode regions arranged to permit access, normal to the plane of the underlying substrate, to an underlying gate electrode region in the first level; whereby contact openings may be formed, normal to the plane of the substrate, to each of the source, drain, and gate electrode regions in both semiconductor device levels.

17 Claims, 13 Drawing Sheets

MULTILEVEL GATE ARRAY INTEGRATED CIRCUIT STRUCTURE WITH PERPENDICULAR ACCESS TO ALL ACTIVE DEVICE REGIONS

CROSS-REFERENCE TO RELATED APPLICATION

This application is a continuation-in-part of U.S. patent application Ser. No. 08/220,732, filed Mar. 31, 1994, now abandoned.

BACKGROUND OF THE INVENTION

1. Field of the Invention

This invention relates to integrated circuit structures. More particularly, this invention relates to a multilevel gate array type integrated circuit structure comprising a first plurality of integrated circuit structures constructed at one level on a substrate and a second plurality of integrated circuit structures constructed at a second level above the first level with access, perpendicular to the plane of the substrate, provided to all regions of all of the integrated circuit structures, regardless of the level at which the integrated circuit structures are located.

2. Description of the Related Art

In the formation of integrated circuit structures such as, for example, MOS devices, a particular type of construction known as a gate array construction is sometimes carried out wherein an array of active devices is constructed on a substrate, such as a semiconductor wafer, and then covered with a layer of oxide, without however, forming the metal bus wiring layers over the structure to thereby form specific structures or circuits, e.g., an invertor, a ring oscillator, NAND gates, and other basic circuits. In this type of construction the source, drain, and gate regions are formed in/on the semiconductor wafer, including polysilicon electrodes, silicide contacts, etc., over the active device regions, followed by formation of an oxide layer. Contact openings are not cut through the oxide to the underlying source and drain regions, or gate electrode contact regions or to electrode portions, however, at this point.

The gate array structure, finished to the point just described, may then be stored or inventoried for future use in the construction of a particular circuitry thereon, in which case, contact openings will be formed to the particular underlying active devices to be incorporated into the particular circuitry and appropriate metal lines and vias will then be formed to complete the wiring of the desired circuitry.

Such a gate array construction technique has proved to be a valuable tool in the formation of custom circuitry, wherein a generic gate array structure may be rapidly converted to a particular wiring structure without the need to carry out all of the construction steps normally needed to construct an entire integrated circuit structure on a bare (unprocessed) semiconductor wafer. This has the commercial advantage of minimizing the time it takes for a prototype design to reach the marketplace. However, in order for such a construction technique to function properly, there must be unrestricted access to all of the regions of all of the active devices in the gate array structure. That is, for an MOS type gate array structure, for example, it must be possible, after the construction of the gate array structure, to still have access, through contact openings directly formed through the overlying insulation normal to the plane of the substrate, to all of the underlying source and drain regions, and gate electrode contact regions comprising the MOS structures.

It is also known to construct active devices of integrated circuit structures stacked above one another to conserve lateral space on the underlying substrate. However, this type of construction is limited to use in the construction of dedicated integrated circuit structures, i.e., integrated circuit structures wherein the particular circuitry has been predetermined prior to construction of the structure. Indeed, in at least some such constructions, some of the inter-electrode wiring or interconnections are already incorporated into the underlying layers before construction thereof of further active integrated circuit devices. Typical stacked structures of this type are shown in Kugimiya et al. U.S. Pat. No. 4,487,635; Sakurai U.S. Pat. No. 4,489,478; Chatterjee U.S. Pat. No. 4,554,572; Sasaki et al. U.S. Pat. No. 4,630,089; Szluk et al. U.S. Pat. No. 4,679,299; and Sugahara et at. U.S. Pat. No. 5,006,913.

Each of these types of construction has its own advantages. The stacked type of construction conserves lateral space, thus permitting increases in the density of the active devices formed on a substrate without the complications which arise each time a new scaling down of the size of the active devices is undertaken. On the other hand, the flexibility and rapid construction of custom circuitry which is made possible by the use of gate array type of construction undeniably results in certain advantages.

It would, therefore, be highly desirable if the features and advantages of both types of construction could be incorporated into a single integrated circuit structure construction.

SUMMARY OF THE INVENTION

It is, therefore, an object of this invention to provide a stacked gate array integrated circuit structure wherein all of the regions of each integrated circuit device, such as source and drain regions, and gate electrode contact regions of an MOS integrated circuit structure, formed in at least two generally parallel semiconductor device levels, may each be subsequently accessed directly through a contact opening formed perpendicular to the plane of the underlying substrate through an overlying insulation layer.

In accordance with a preferred embodiment of the invention, the multilevel gate array integrated circuit structure of the invention comprises an MOS-type structure having a semiconductor substrate; a first semiconductor device level formed in and on the substrate comprising one or more first source regions, one or more first drain regions, and one or more first gate electrode regions; a first insulation layer formed over the first level; a second semiconductor device level formed over the first insulation layer and comprising one or more second source regions arranged to permit access, perpendicular to the plane of the underlying substrate, to an underlying first source region in the first level, one or more second drain regions arranged to permit access, perpendicular to the plane of the underlying substrate, to an underlying drain region in the first level, and one or more second gate electrode regions arranged to permit access, perpendicular to the plane of the underlying substrate, to an underlying gate electrode region in the first level; and a second insulation layer formed over the second semiconductive level; whereby contact openings or vias may be formed, perpendicular to the plane of the substrate, to each of the source and drain regions, and gate electrode contact regions in both semiconductor device levels.

DETAILED DESCRIPTION OF THE INVENTION

The multilevel gate array integrated circuit structure of the invention comprises a structure including a semiconductor substrate, a first semiconductor device level formed in and on the substrate and containing active devices regions, a first insulation layer, at least a second semiconductor device level over the first insulation layer containing active device regions, and a second insulation layer formed over the second semiconductor device level.

Preferably, the multilevel gate array integrated circuit structure of the invention comprises an MOS-type integrated circuit structure including a semiconductor substrate, a first MOS device level formed in and on the substrate and comprising one or more first source regions, one or more first drain regions, and one or more first gate electrode regions; a first insulation layer formed over the first level; at least a second MOS device level comprising a layer of semiconductor material formed over the first insulation layer, and further comprising one or more second source regions, one or more second drain regions, and one or more second gate electrode regions, with the source, drain, and gate electrode regions in the second MOS device level arranged to permit access, perpendicular to the plane of the underlying substrate, to the underlying source, drains, and gate electrode regions in the first level; and a second insulation layer formed over the second MOS device level; whereby contact openings or vias may be formed, perpendicular to the plane of the substrate, to each of the source and drain regions, and gate electrode contact regions in both levels.

By the provision of direct perpendicular access to all of the source and drain regions, and gate electrode contact regions in all of the levels, in accordance with the invention, space may be conserved by such vertical stacking without sacrificing the flexibility of gate array type technology wherein custom patterning or connection of the various source and drain regions, and gate electrode contact regions into various electrical circuitry may be carried out after the construction of the basic multilevel gate array structure of the invention.

By way of illustration, and not of limitation, the multilevel gate array integrated circuit structure of the invention will be illustrated as a two level MOS-type multilevel gate array integrated circuit structure constructed using silicon as the semiconductor material, it being understood that other active devices may also be constructed in one or more of the levels, that more than two semiconductor device levels may be used, and that other semiconductor materials may be used instead of silicon.

Figure 1:
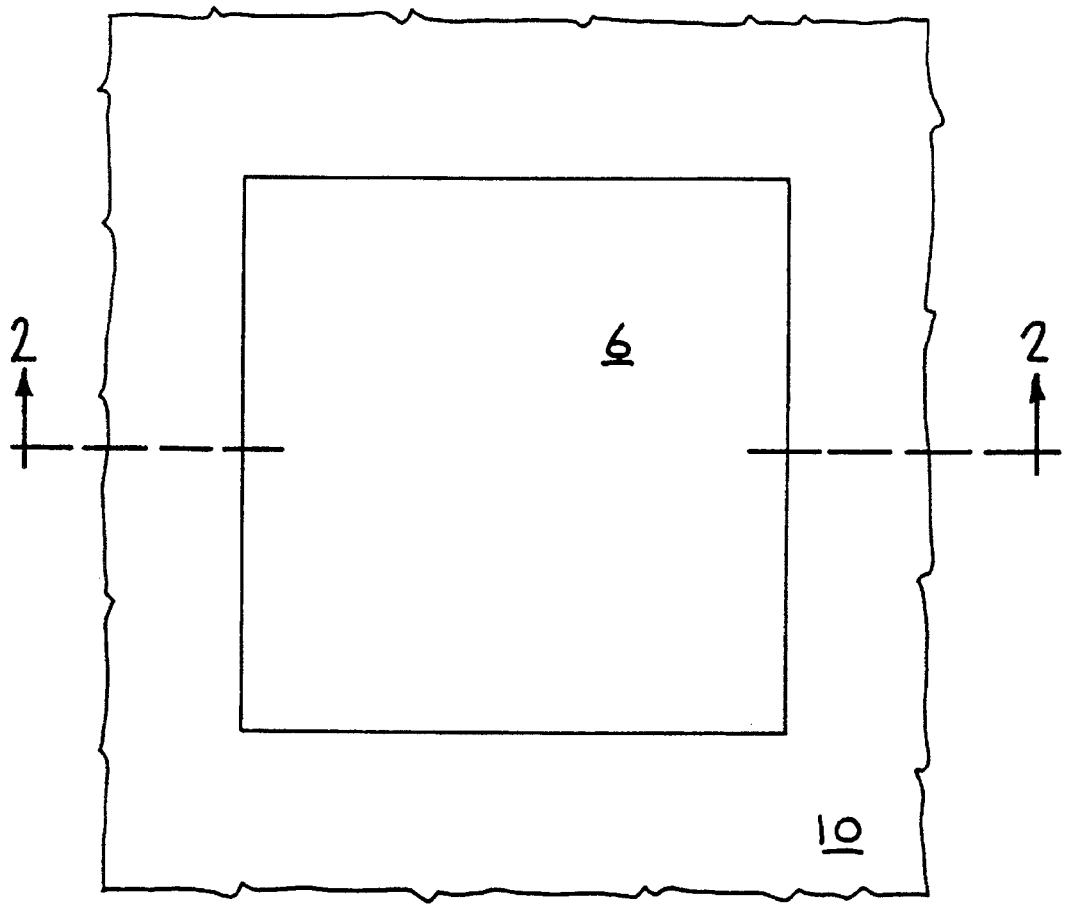
FIG. 1 is a fragmentary top view of the first stage (of constructing the multilevel gate array integrated circuit structure of the invention.
Figure 2:
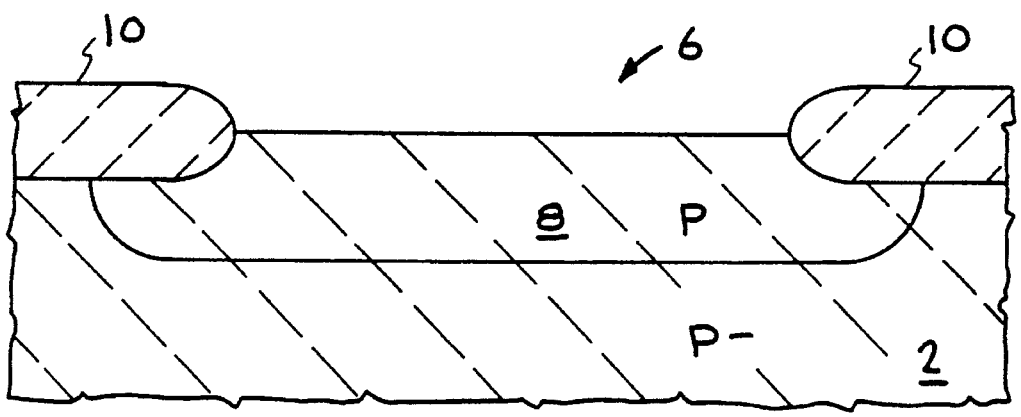
FIG. 2 is a fragmentary vertical side section view of the structure of FIG. 1 taken along lines 2—2.

Referring now to the drawings, a first embodiment of the multilevel gate array structure of the invention is sequentially illustrated in FIGS. 1–12. In FIGS. 1 and 2, an island 6 is shown formed in substrate 2 surrounded by field oxide 10. In the illustrated embodiment, a P-well 8 is formed in a P-doped semiconductor substrate, such as a silicon semiconductor wafer, and after masking of P-well 8, the window is formed by growing field oxide 10 in the unmasked surface of substrate 2. Gate oxide 12 and polysilicon gate electrode 14 may then be formed over the silicon surface of island 6, by appropriate masking and respective patterning of a gate oxide layer and a polysilicon electrode layer, and the unmasked portions of island 6 may then be doped to form source region 16 and drain region 18 in island 6.

Figure 3:
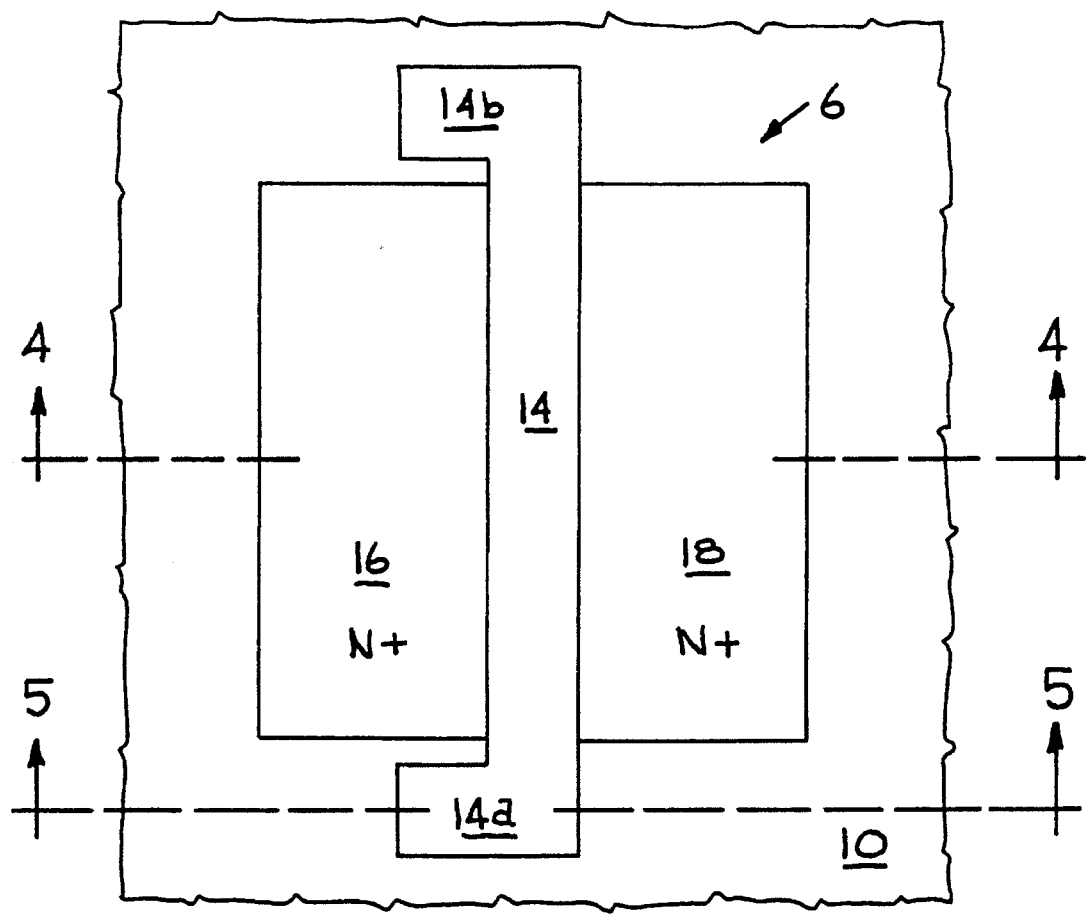
FIG. 3 is a fragmentary top view of a further stage in the construction of the first embodiment of the multilevel gate array integrated circuit structure of the invention.
Figure 4:
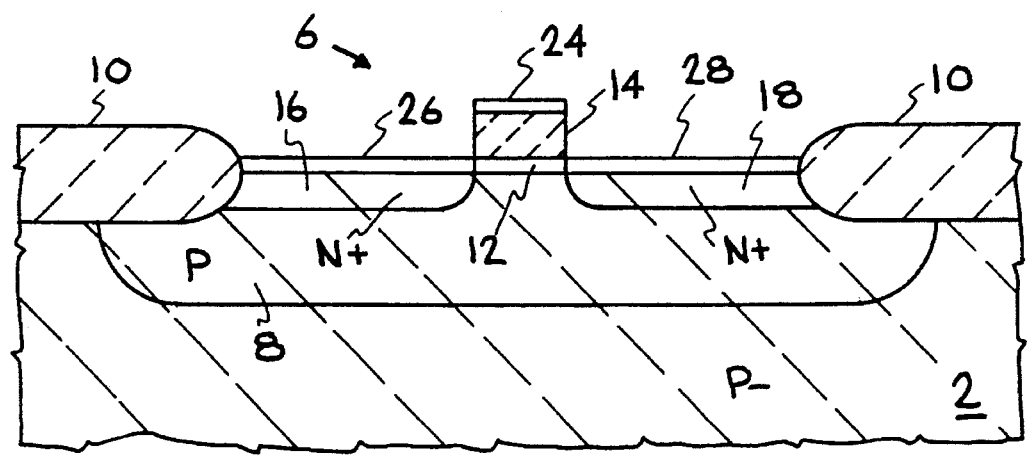
FIG. 4 is a fragmentary vertical side section view of the structure of FIG. 3 taken along lines 4—4.
Figure 5:
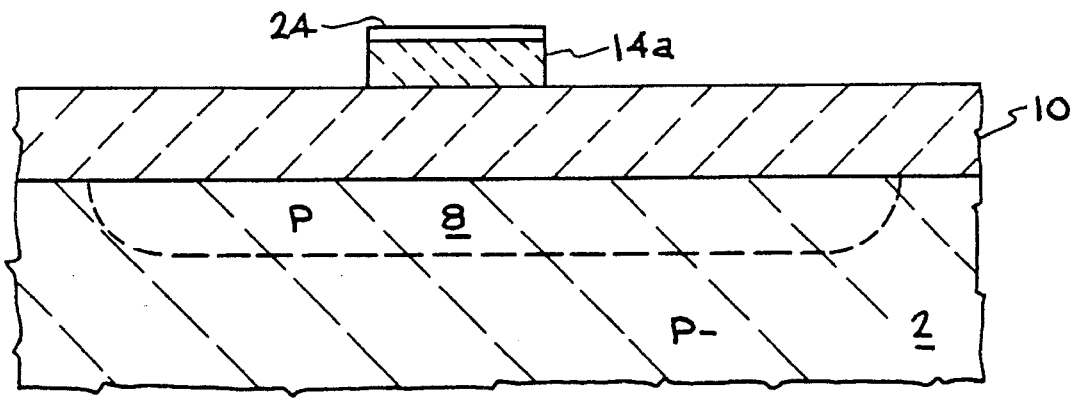
FIG. 5 is a fragmentary vertical side section view of the structure of FIG. 3 taken along lines 5—5.

Turning now to FIGS. 3 and 5, it will be noted that gate electrode contact regions or portions 14a and 14b of gate electrode 14 extend over field oxide 10, as is conventional in the formation of single level gate array structures. The exposed silicon surfaces of source region 16, drain region 18, and gate electrode 14 may then be silicided, e.g., by depositing a metal layer over the silicon and then heating it to form the silicide, or by directly depositing a metal silicide over the silicon surfaces, resulting in the structure shown in FIGS. 3, 4, and 5, with silicide portions 24, 26, and 28 formed respectively over gate electrode 14, source region 16, and drain region 18.

The described construction, up to this point, is conventional for the construction of a single level gate array MOS integrated circuit structure. Thus, other conventional structures or techniques used in the construction of single level gate array structures, but not illustrated or described herein, such as, for example, the formation of LDD regions or threshold adjustment implants beneath the field oxide, etc. may also be used in the construction of the gate array structure of the invention.

Figure 6:
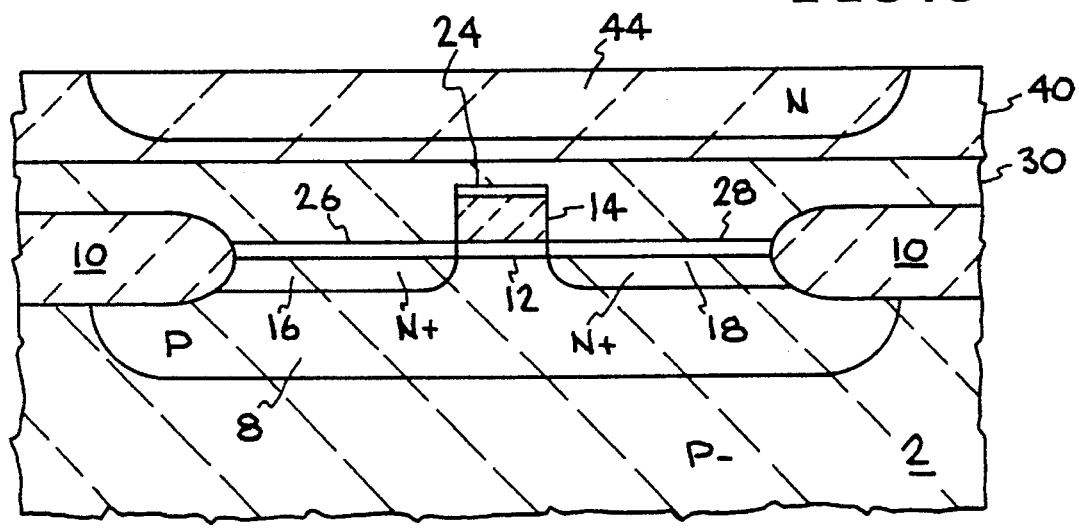
FIG. 6 is a fragmentary vertical side section view of a further stage in the construction of the first embodiment of the multilevel gate array integrated circuit structure of the invention.

Turning now to FIG. 6, an oxide layer 30 is now formed over the first level of gate array structures of FIGS. 3–5. Oxide layer 30 may be formed to an average thickness of from about 0.5 micrometers (μm or microns) to about 1.5 μm (microns), preferably about 1 μm (microns). A semiconductor layer 40, such as a single crystal silicon or polysilicon material, is then deposited over oxide layer 30 to an average thickness ranging from about 0.5 μm (microns) to about 1.5 μm (microns), preferably about 1 μm (microns). Semiconductor layer 40 may be formed by chemical vapor deposition (CVD), or by use of a low temperature epitaxial reactor.

Preferably, semiconductor layer 40 will be appropriately doped to provide a high mobility semiconductor material, as is well known to those skilled in the art. For example, when silicon is N-doped, using phosphorus, arsenic, or antimony N-type dopants, the silicon will be sufficiently doped to provide a high N-type mobility. By "high N-type mobility" for an N-doped silicon semiconductor is meant a hole mobility of at least about 200 volts/cm$^2$ sec. For P-doped silicon, doped to provide a high P-type mobility, e.g., by doping with boron P-type dopant, the silicon will be doped sufficiently to provide an electron mobility of at least about 600 volts/cm$^2$ sec. For other types of semiconductor material, the level of doping will be adjusted accordingly to provide the equivalent high level of hole or electron mobility therein. Such doping to form high mobility semiconductor material is described in more detail, for example, in chapters 5 and 6 of "Silicon Processing for the VLSI Era, Volume 1—Process Technology" by Stanley Wolf and Richard N. Tauber, Lattice Press. Semiconductor layer 40 will be hereinafter referred to as silicon layer 40, by way of illustration, and not of limitation.

Figure 7:
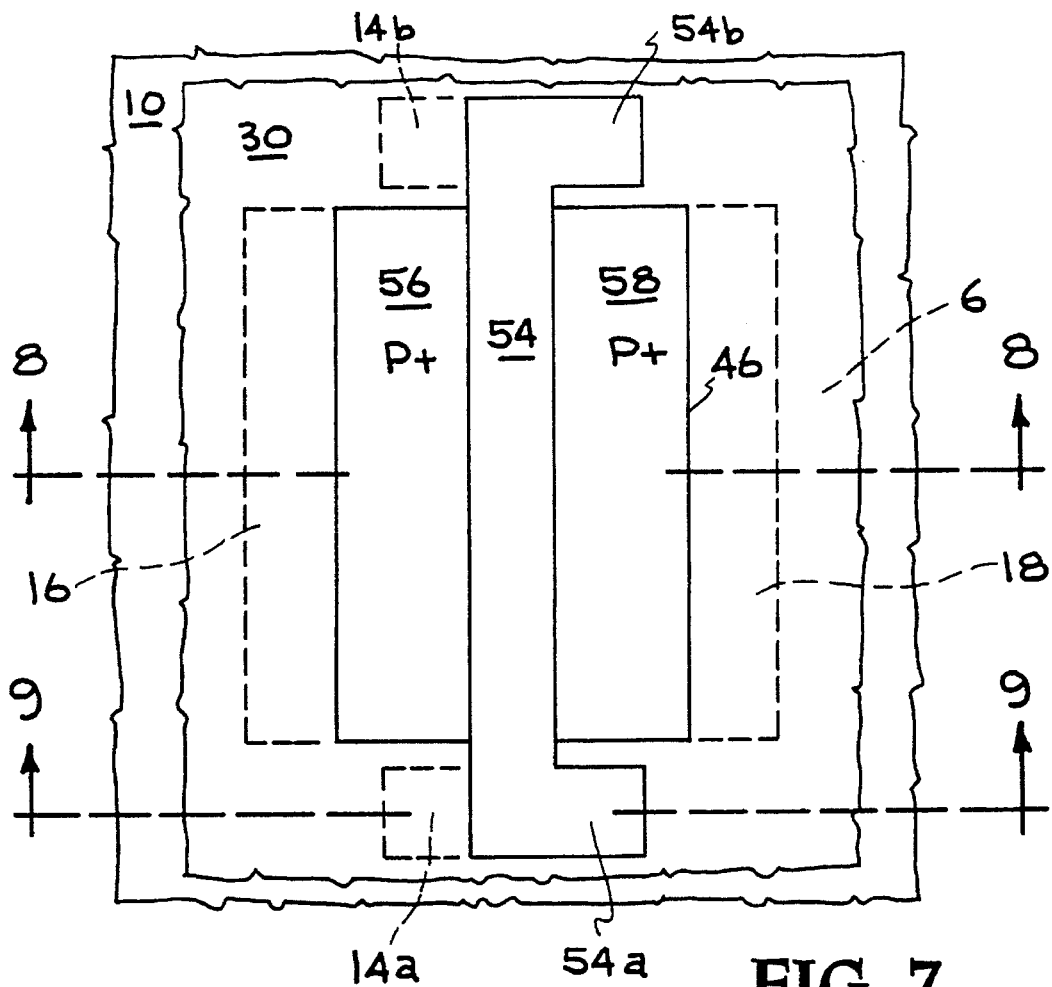
FIG. 7 is a fragmentary top view of a further stage in the construction of the first embodiment of the multilevel gate array integrated circuit structure of the invention.

After formation of doped silicon layer 40 over the structure, layer 40 may be masked to permit formation of N-well 44. A second mask is then formed over layer 40 to allow formation of field oxide only in portions 50 of the unmasked surfaces of silicon layer 40, resulting in the formation of islands 46, as shown in FIG. 7. It will be noted that island 46 is smaller in one dimension, i.e., width, than underlying island 6. This is to permit direct vertical access to underlying source region 16 and drain region 18, i.e., access to the underlying source and drain regions in the first level of semiconductor devices which is perpendicular to the plane of substrate 2, in accordance with the invention. Such direct vertical or perpendicular access to the underlying source and drain regions, as well as to the underlying gate electrode contact regions, in the lower level of semiconductor devices is an important feature of the present invention, as this permits preservation of the aspect of versatility or flexibility, in the multilevel gate array structure of the invention, which has previously characterized only the conventional single level gate array structure.

Figure 9:
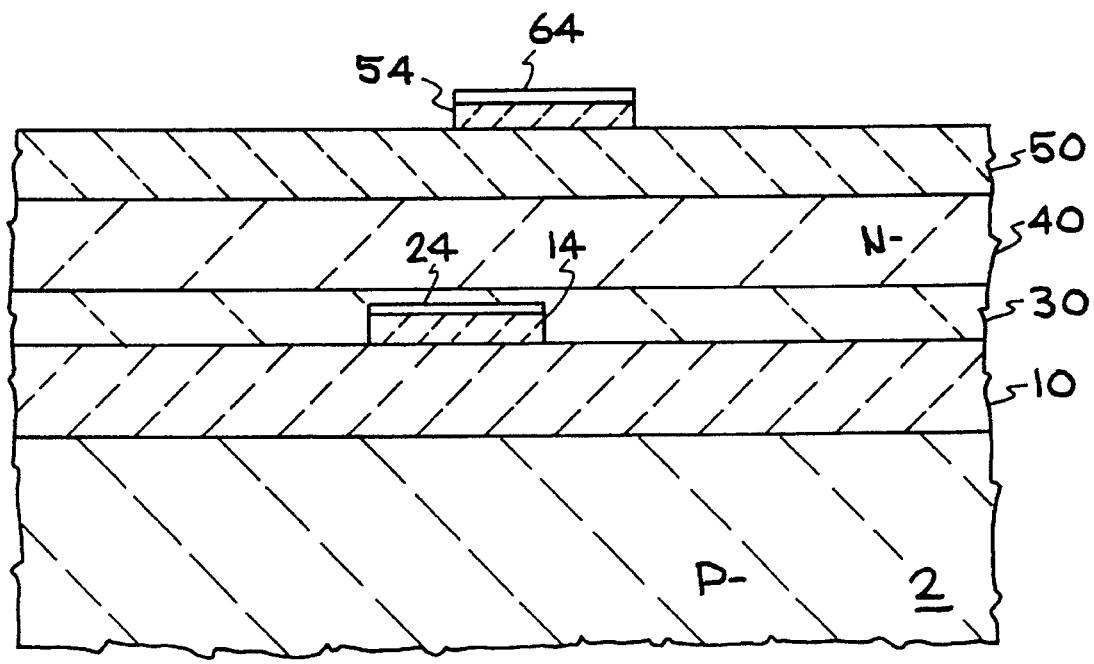
FIG. 9 is a fragmentary vertical side section view of the structure of FIG. 7 taken along lines 9—9.

Gate oxide 52 and polysilicon gate electrode 54 may then be formed over the silicon surface of island 46 by appropriate masking and the unmasked portions of island 46 may be doped to form source region 56 and drain region 58. Gate electrode contact portions 54a and 54b of gate electrode 54 extend over field oxide 50, in similar fashion to contact portions 14a and 14b of underlying gate electrode 14. However, as shown in FIGS. 7 and 9, it will be noted that gate electrode contact portions 54a and 54b extend over field oxide 50 at a right angle to the length of gate electrode 54 which is 180° to the disposition of gate electrode contact portions 14a and 14b, thus permitting direct vertical access to gate electrode contact portions 14a and 14b, as well as 54a and 54b. This is seen in FIG. 7, wherein underlying gate electrode contact portions 14a and 14b are shown in dotted lines, and in FIG. 9 wherein underlying gate electrode contact portion 14a is shown disposed in staggered fashion to overlying gate electrode contact portion 54a. As discussed above, this preservation of direct vertical or perpendicular access to the underlying gate electrode contact portions in the lower layer is very important to the present invention.

Figure 8:
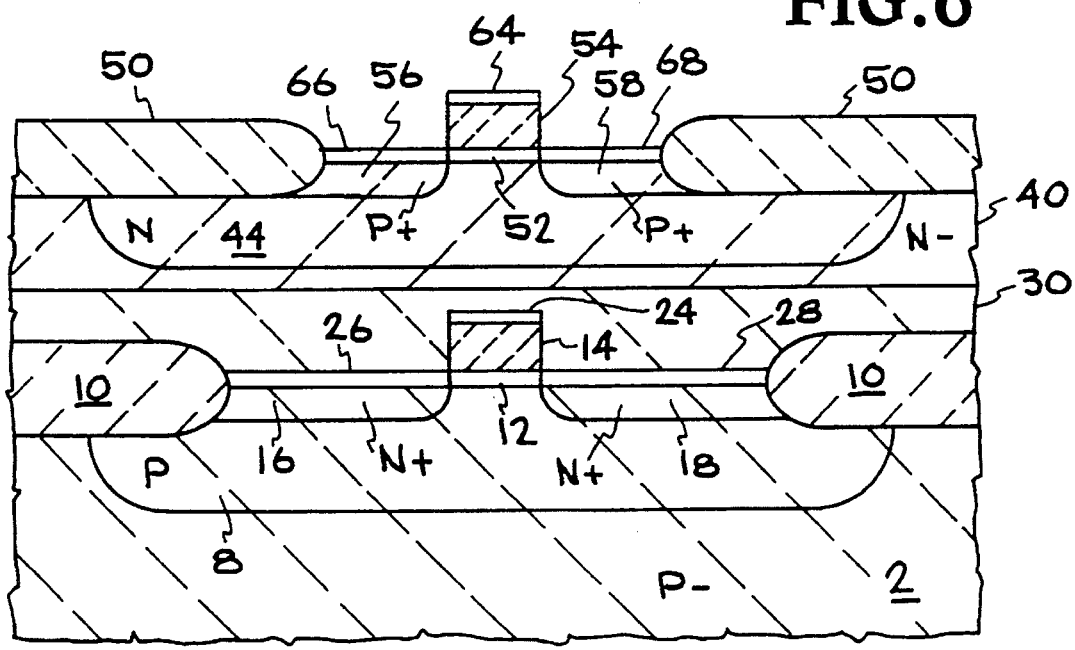
FIG. 8 is a fragmentary vertical side section view of the structure of FIG. 7 taken along lines 8—8.

After formation of gate electrode 54, source region 56, and drain region 58, the silicon surfaces of gate electrode 54, source region 56, and drain region 58 may then be silicided, as previously described, resulting in the structure shown in FIGS. 8 and 9, with silicide portions 64, 66, and 68 formed respectively over gate electrode 54, source region 56, and drain region 58. An oxide insulation layer 70 is then formed over the second level gate array structure. Oxide layer 70 may be formed to an average thickness of from about 0.5 micrometers (microns) to about 1.5 µm (microns), preferably about 1 µm (microns). Formation of oxide layer 70 over silicided surfaces 64, 66, and 68 respectively on gate electrode 54, source region 56 and drain region 58, as shown in FIGS. 9 and 10, completes the formation of this embodiment of the two level gate array MOS structure of the invention.

It should be noted that, as previously described with respect to the first gate array level, conventional structures or techniques used in the construction of single level gate array structures not illustrated herein may also be used in the construction of the second gate array device level in the structure of the invention.

The completed two level gate array structure of the invention may now be customized, as is well known to those skilled in the art, by the provision of appropriate perpendicular contact openings through the respective oxide insulation layers to interconnect certain of the source and drain regions, and gate electrode contact regions or portions to overlying metal lines subsequently formed over oxide layer 70 to provide the particular desired electronic circuitry.

Figure 10:
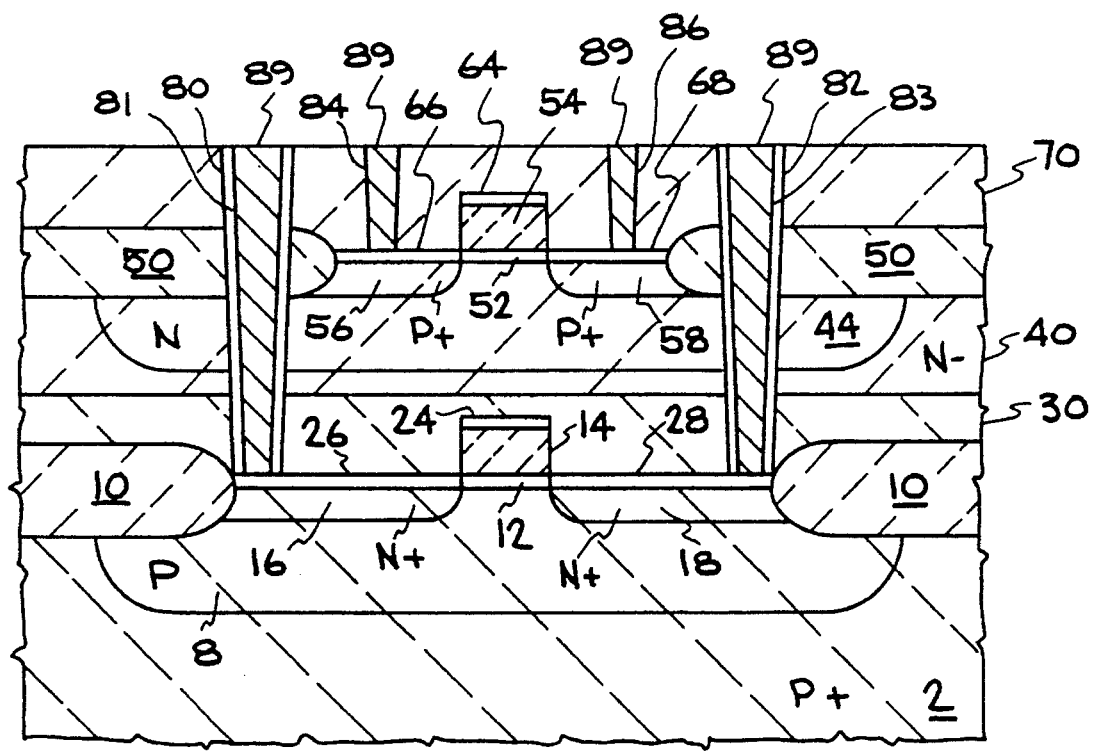
FIG. 10 is a fragmentary vertical side section view of the first embodiment of the multilevel gate array integrated circuit structure of the invention, showing the provision of direct access to the underlying source and drain regions in both levels of the gate array through contact openings disposed perpendicular to the plane of the underlying substrate.
Figure 11:
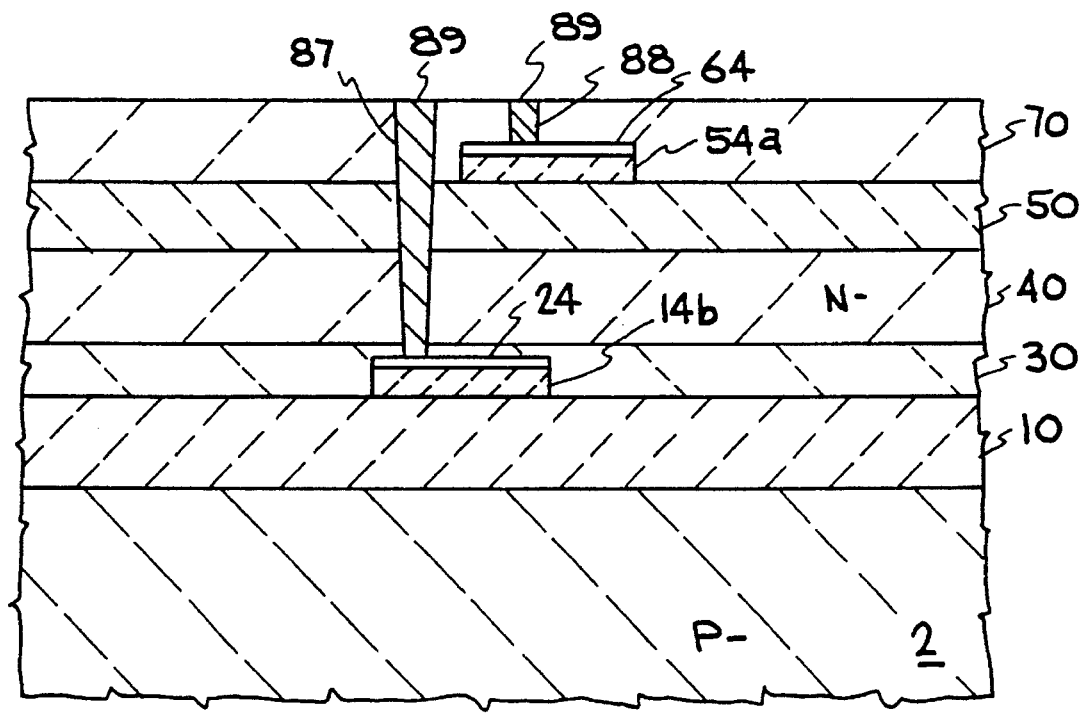
FIG. 11 is a fragmentary vertical side section view of the first embodiment of the multilevel gate array integrated circuit structure of the invention, showing the provision of direct access to the underlying gate electrode contact regions in both levels of the gate array through contact openings disposed perpendicular to the plane of the underlying substrate.
Figure 12:
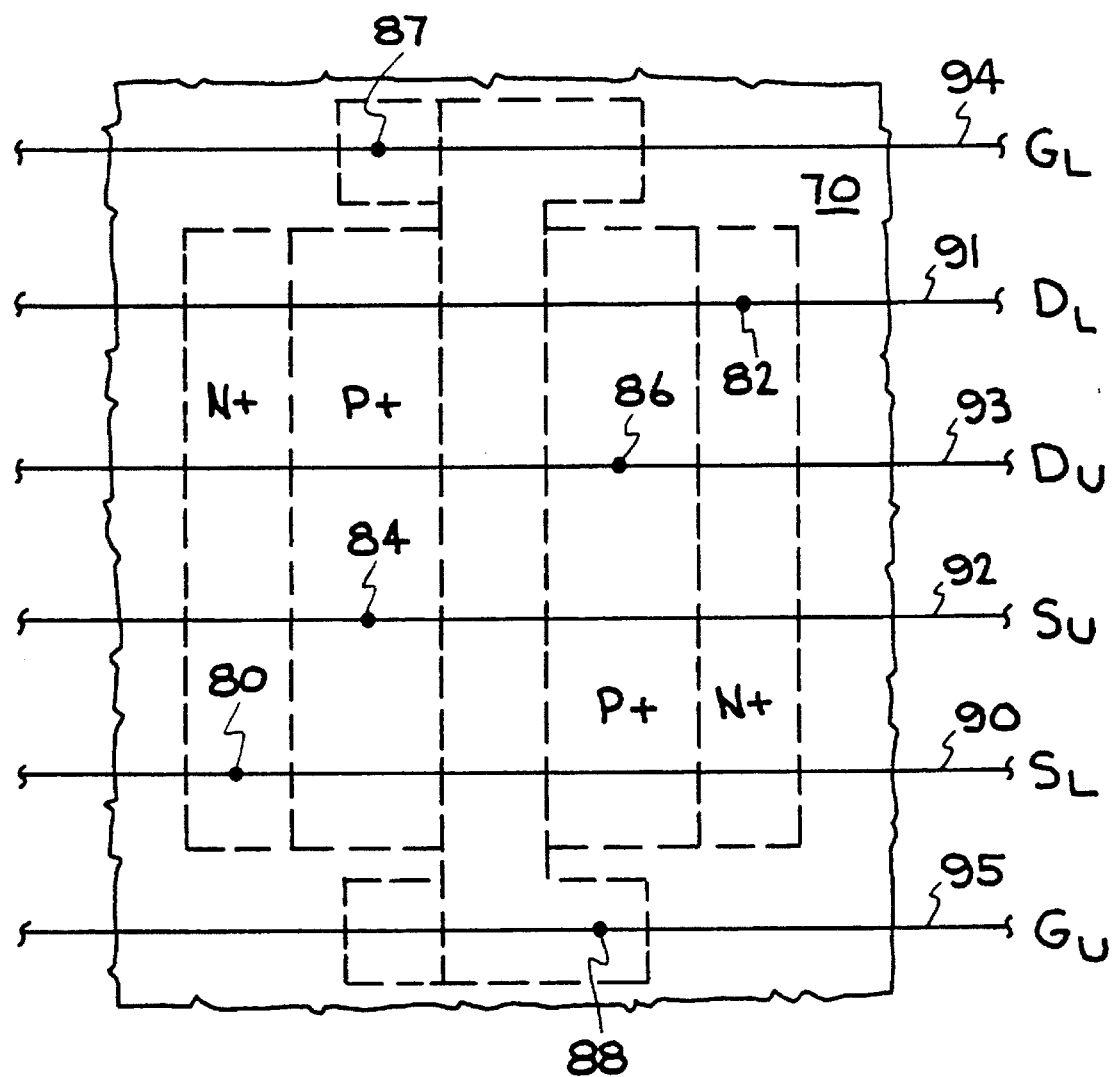
FIG. 12 is a fragmentary top view of the first embodiment of the multilevel gate array integrated circuit structure of the invention, showing metal lines connected to the various source and drain regions, and gate electrode contact regions through contact openings.

This is shown, by way of example, in FIGS. 10–12. In FIG. 10, contact openings are shown cut to the source and drain regions on both levels, while FIG. 11 shows contact openings cut to the gate electrode contact regions on both levels. It must be noted that FIGS. 10 and 11 are by way of example only, to show how the contact openings would be formed to contact the respective source and drain regions, and gate electrode contact regions. It will be readily appreciated, from an examination of FIG. 12, that at any given cross-section, there will not be contact openings cut to all of the source and drain regions and gate electrode contact regions in both levels of the two level gate array structure of the invention.

Thus, as shown in FIG. 10, a contact opening 80 may be cut through oxide layer 70, field oxide 50, silicon layer 40, and oxide layer 30 to silicide 26 on source region 16 to provide an electrical contact to lower level source region 16, which contact is generally perpendicular to the plane of substrate 2, as shown in FIG. 10. An oxidation is then done to form an oxide 81 on the sidewalls of contact opening 80 to prevent shorting of conductive filler 89 to silicon layer 40 through which contact opening 80 passes.

Contact opening 80 may then be filled with an appropriate conductive filler material 89, e.g., polysilicon, tungsten, aluminum, etc. to provide an electrical connection between source region 16 and a metal line subsequently formed over oxide layer 70, e.g., metal line 90 shown in FIG. 12.

Similarly, contact opening 82 may be cut through oxide layer 70, field oxide 50, silicon layer 40, and oxide layer 30 to silicide 28 on drain region 18 which is then also lined with oxide 83 and then filled with conductive filler material 89, as also shown in FIG. 10, to provide an electrical connection generally perpendicular to the plane of substrate 2 between drain region 18 and a metal line subsequently formed over oxide layer 70, such as metal line 91 shown in FIG. 12.

It should be noted that as an alternative to lining contact openings 80 and 82 with oxide 81 and 83, field oxide 50 could be extended down to oxide layer 30, so that contact openings 80 and 82 would not pass through silicon layer 40, thus eliminating the need to line contact openings 80 and 82 with oxide.

To provide electrical connections to upper source region 56 and upper drain region 58, contact openings 84 and 86 may be respectively cut through oxide layer 70 to silicide 66 and 68 and then both filled with conductive filler material 89, as shown in FIG. 10, to provide further electrical connection generally perpendicular to the plane of substrate 2, respectively, between source region 56 and drain region 58 and metal lines subsequently formed over oxide layer 70, such as metal lines 92 and 3 shown in FIG. 12.

Contact openings are also cut through the oxide to the lower and upper gate electrode contact portions. As shown in FIG. 11, a contact opening 87 is cut through oxide layer 70, as well as field oxide 50, to silicide 24 on lower gate electrode contact portion 14b, and then filled with conductive filler material 89 to provide an electrical connection to a metal line such as line 94 shown in FIG. 12. Contact opening 88 is cut through oxide layer 70 to silicide 64 on upper gate electrode contact portion 54a and then filled with conductive filler 89 to provide electrical contact to a metal line such as line 95 in FIG. 12.

Thus, as shown in FIGS. 10–12, all of the source and drain regions, and gate electrode contact regions, for both levels, are directly accessible through contact openings formed from the surface of oxide layer 70 perpendicular to the plane of substrate 2. Thus, the two level gate array type structure may be preformed through application of oxide insulation layer 70 over the entire upper level, including the upper source and drain regions and gate electrode contact regions; and then subsequently customized to form specific electronic circuitry at a later time due to complete accessibility of all of the source and drain regions and gate electrodes of both levels.

Figure 13:
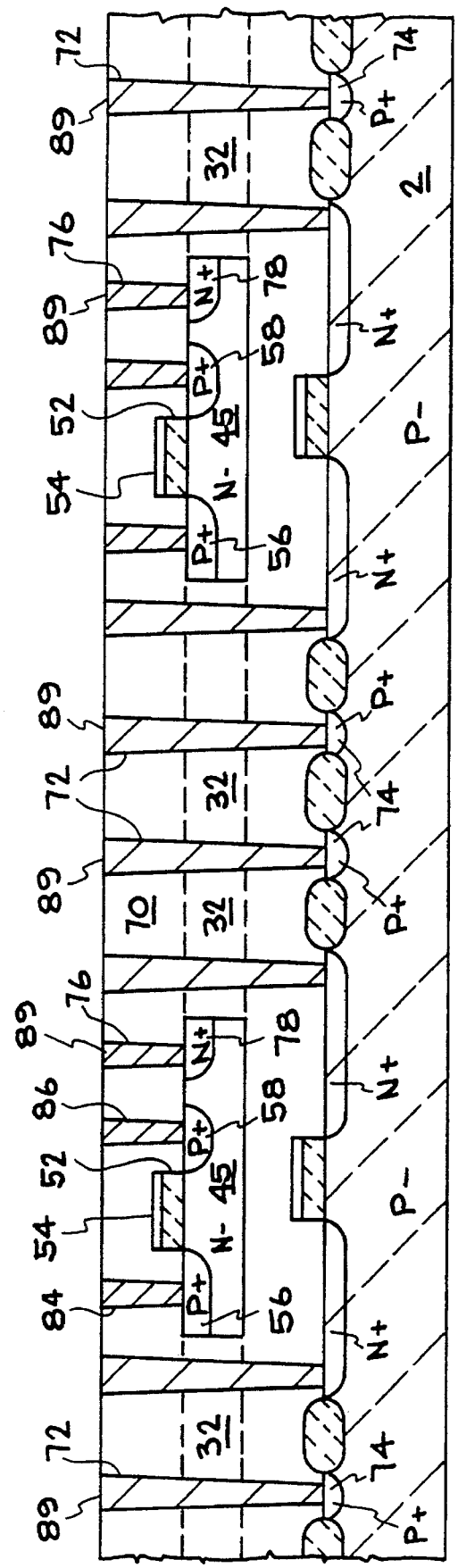
FIG. 13 is a fragmentary vertical side section view of a variation of the multilevel gate array integrated circuit structure shown in FIG. 10, showing the provision of contacts to the substrate at both levels, and also showing the formation of the upper level of semiconductor devices formed with trench isolation surrounding the active devices.

FIG. 13 show a variation of the embodiment shown in FIG. 10 wherein one or more contact openings 72, which are also filled with conductive contact filler material 89, are also formed to provide electrical contact to P+contact region 74 of substrate 2, whereby substrate currents may be appropriately inhibited, as is well known to those skilled in the art. Similarly, in FIG. 13, contact opening 76, which is also filled with filler material 89, provides contact with silicon layer 40 through contact region 78.

Figure 14:
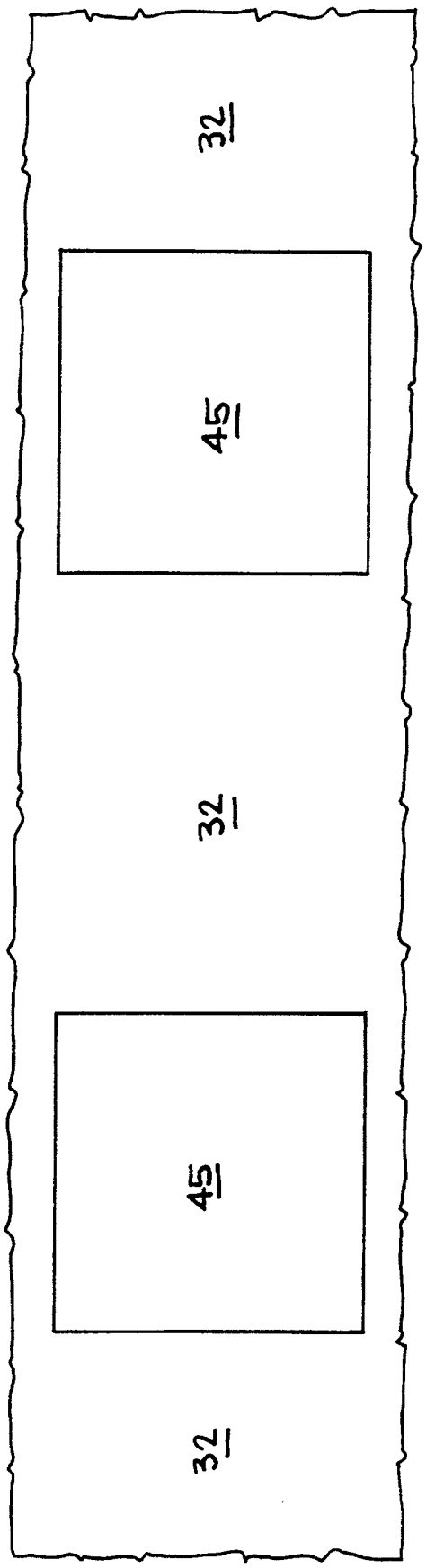
FIG. 14 is a fragmentary top view of a portion of the structure of FIG. 13 illustrating the trench isolation surrounding the active device region of the upper level of the multilevel gate array integrated circuit structure of the invention.

FIGS. 13 and 14 also show a variation in the first embodiment of the invention wherein the upper level of semiconductor devices are isolated from one another by trench type isolation. In the illustrated variation or embodiment, silicon layer 40, after its formation over oxide layer 30, is masked in the areas where the active devices are to be formed, and then etched to remove some or all of the unmasked portions of silicon layer 40, leaving islands 45. This region or "trench" is then filled with oxide 32 which then forms an oxide insulation or isolation surrounding each island 45 and the active devices formed thereon from other islands 45 and active devices formed on such other islands 45 on the same level.

Figure 15:
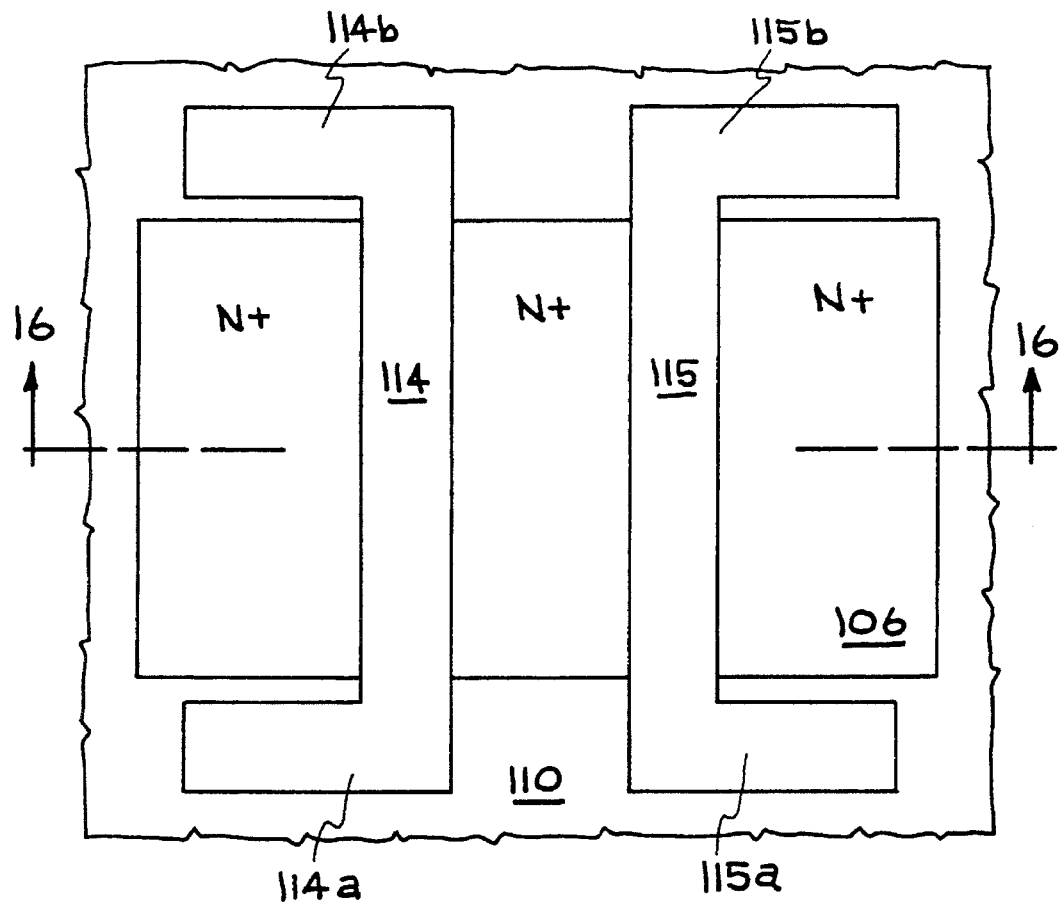
FIG. 15 is a fragmentary top view of an early stage in the construction of a second embodiment of the multilevel gate array integrated circuit structure of the invention.
Figure 16:
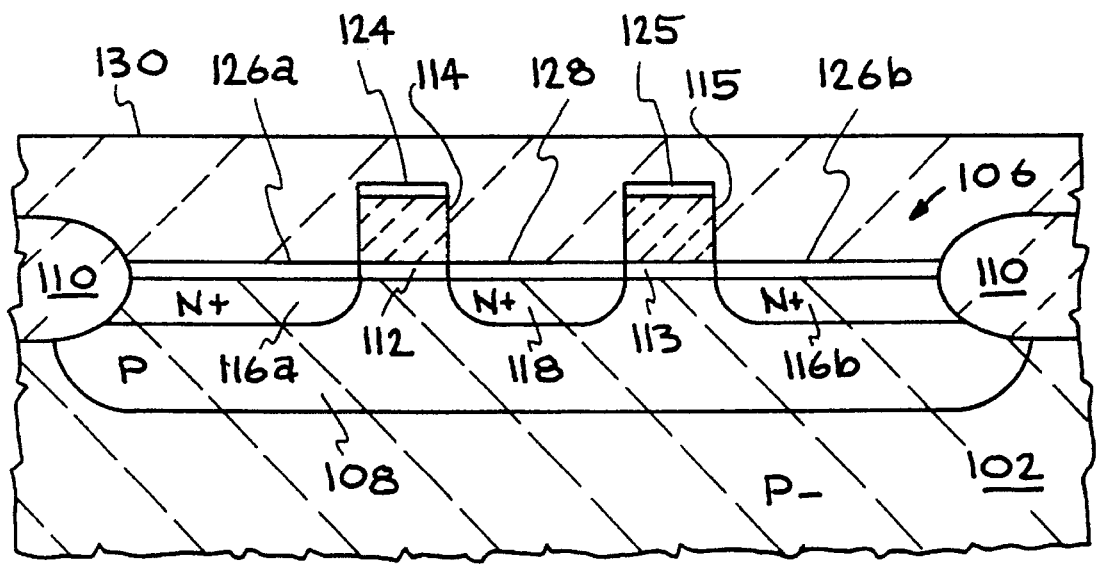
FIG. 16 is a fragmentary vertical side section view of the structure of FIG. 15 taken along lines 16—16.

Turning now to FIGS. 15–24, another embodiment of the multilevel gate array structure of the invention is illustrated wherein each level is provided with two source regions, a common drain region, and two gate electrodes. In this embodiment, an island 106 is formed in substrate 102 surrounded by field oxide 110. Gate oxide, as shown at 112 and 113 in FIG. 16, is formed and gate electrodes 114 and 115 are then formed. Gate electrodes 114 and 115 are respectively formed with gate electrode contact portions 114a and 114b, and 115a and 115b, at the respective ends of the gate electrodes, with contact portions 114a and 114b of gate electrode 114 facing in an opposite direction to contact portions 115a and 115b of gate electrode 115, as shown in FIG. 15.

Source regions 116a and 116b, and drain region 118 are formed in P well 108 of substrate 102 by appropriate doping, e.g., phosphorus or arsenic doping to provide N type doping for NMOS devices, and the exposed silicon surfaces are then silicided to form silicide portions 124, 125, 126a, 126b, and 128, respectively over gate electrodes 114 and 115, source regions 116a and 116b, and common drain region 118, as seen in FIG. 16. An oxide insulation layer 130 is then applied over the structure to complete the formation of the first layer of the gate array structure of the invention. As in the formation of oxide insulation layer 30 in the previous embodiment, oxide layer 130 may vary in average thickness from about 0.5 micrometers (microns) to about 1.5 μm (microns), preferably about 1 μm (microns).

Figure 18:
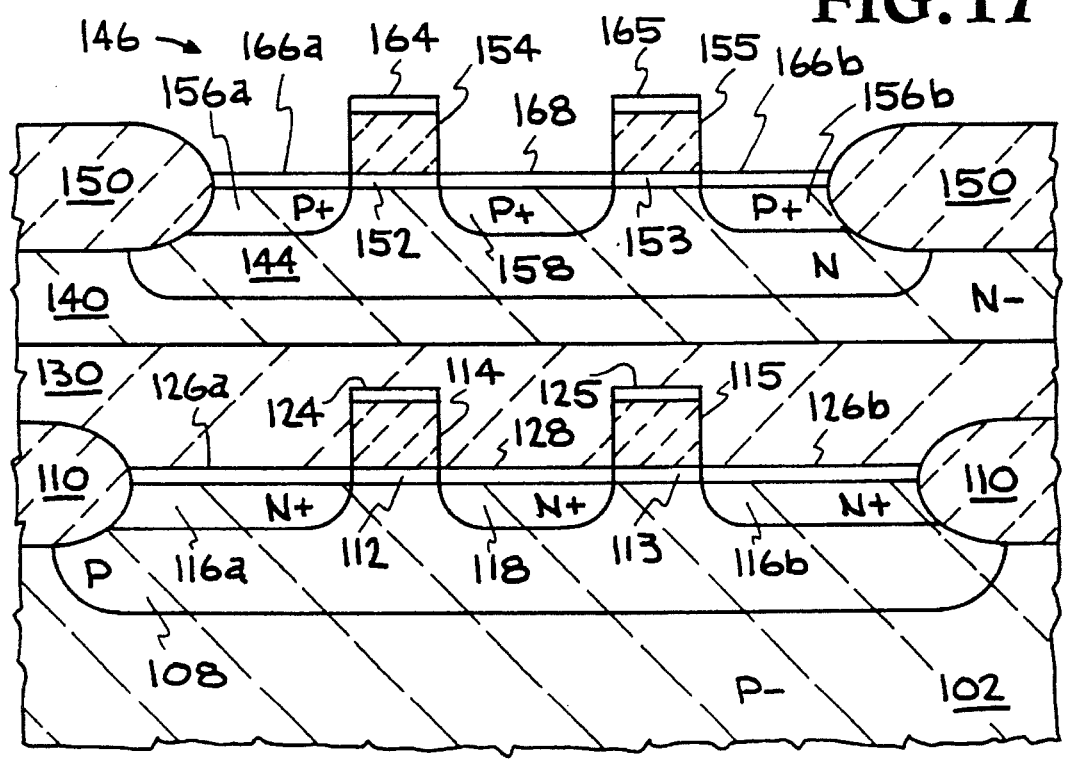
FIG. 18 is a fragmentary vertical side section view of the structure of FIG. 17 taken along lines 18—18.

Semiconductor layer 140 is then formed over oxide layer 130 to an average thickness of from about 0.5 micrometers (microns) to about 1.5 μm (microns), preferably about 1 μm (microns), as shown in FIG. 18. As in the formation of doped semiconductor layer 40 in the previous embodiment, layer 140 may be appropriately doped to preferably provide a desired high mobility semiconductor layer. Semiconductor layer 140 usually will comprise single crystal silicon or polysilicon and will be referred to hereinafter as silicon layer 140, by way of illustration, and not of limitation.

Figure 20:
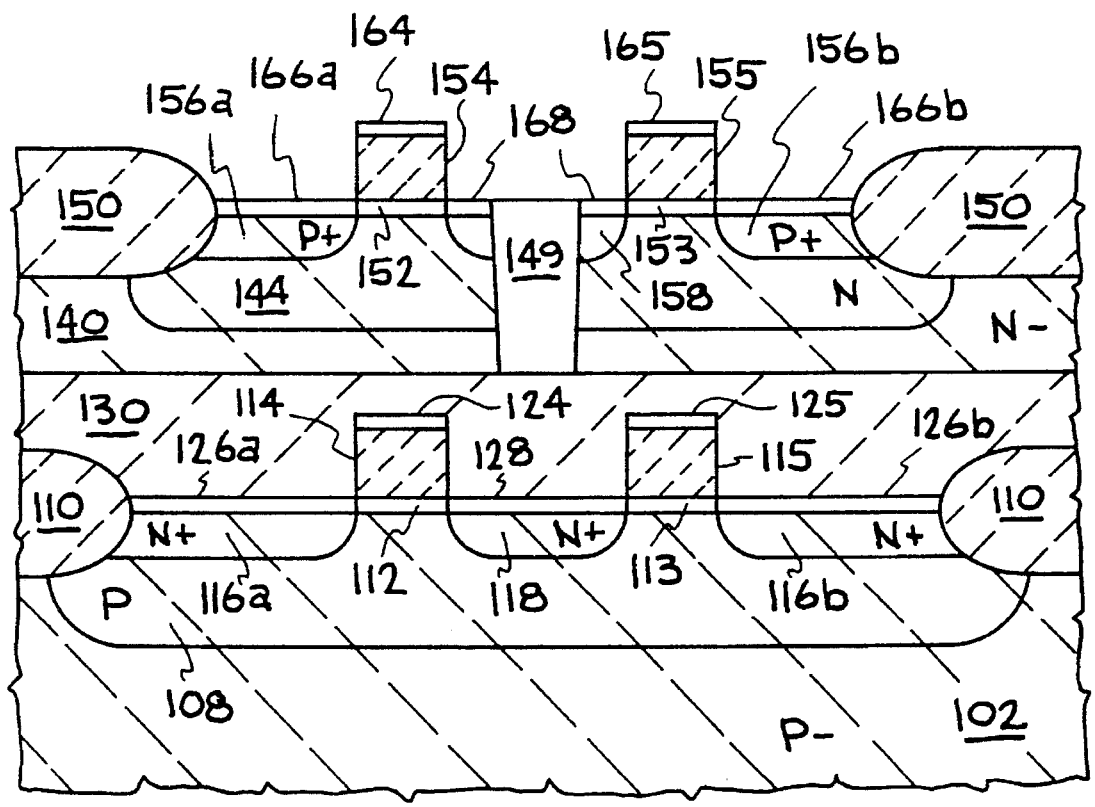
FIG. 20 is a fragmentary vertical side section view of the structure of FIG. 17 taken along lines 20—20.

Silicon layer 140 is then masked to permit formation of N-well 144 therein. A second mask is then formed over silicon layer 140 to permit formation of field oxide 150 in the unmasked surfaces of silicon layer 140, resulting in the formation of islands 146. As in the previous embodiment, island 146 is smaller in one dimension than underlying island 106 to permit direct vertical access to underlying source regions 116a and 116b. However, due to the position of drain region 158 in this embodiment, some provision must be made for forming direct vertical (perpendicular) contact to underlying drain region 118. In this embodiment, such provision is provided by the formation of small oxide regions or islets 148 and 149 in the portion or region of island 146 between polysilicon gate electrodes 154 and 155 which will form common drain region 158. Oxide regions 148 and 149 preferably extend completely through silicon layer 140 down to oxide layer 130, as seen in FIG. 20. Oxide regions 148 and 149 may be formed at the same time as field oxide 150 is grown, or may be formed by placing a mask defining oxide portions 148 and 149 over oxide layer 130 prior to deposition of silicon layer 140, and then, after deposition of layer 140, removing the mask and filling the resultant openings in silicon layer 140 with oxide. Provision of oxide regions 148 and 149 permit subsequent formation of contact openings therethrough to provide direct vertical or perpendicular access to underlying drain region 118.

Gate oxide 152 and 153 is then formed in island 146 and polysilicon gate electrodes 154 and 155 are then formed respectively over gate oxide 152 and 153. Source regions 156a and 156b, and common drain region 158 are then formed by appropriate doping of silicon layer 140. The exposed silicon surfaces of gate electrodes 154 and 155, source regions 156a and 156b, and drain region 158 are then silicided to respectively form silicide portions 164, 165, 166a, 166b, and 168 thereon, as shown in FIGS. 17–20.

Figure 17:
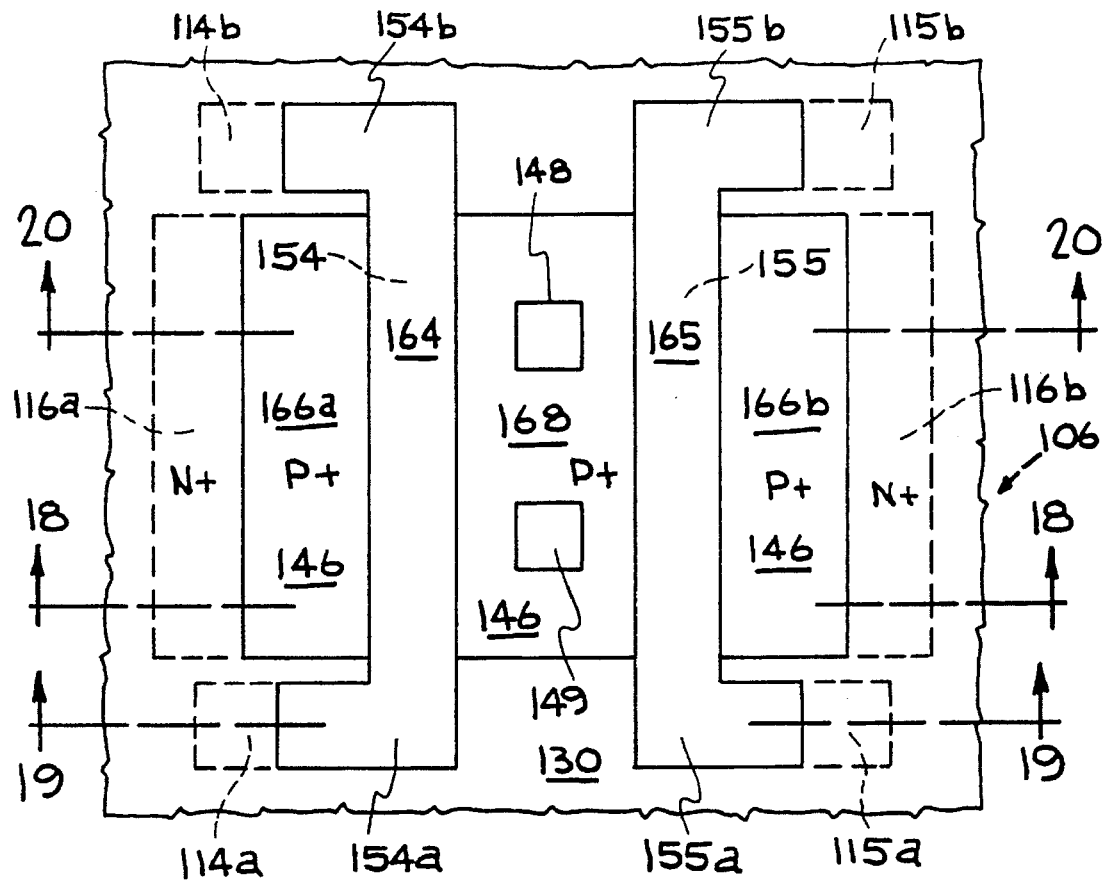
FIG. 17 is a fragmentary top view of a further stage in the construction of the second embodiment of the multilevel gate array integrated circuit structure of the invention.
Figure 19:
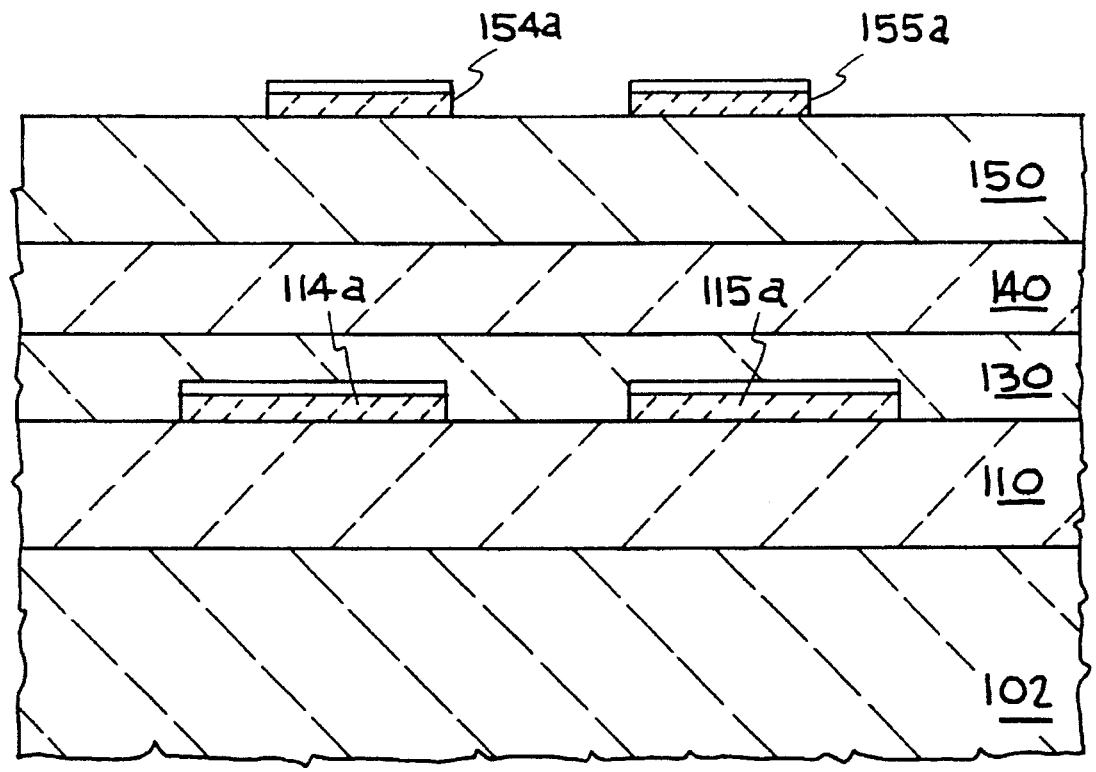
FIG. 19 is a fragmentary vertical side section view of the structure of FIG. 17 taken along lines 19—19.

As seen in FIGS. 17 and 19, gate electrode contact portions 154a, 154b, 155a, and 155b do not extend, at a right angle to gate electrodes 154 and 155, as far as underlying gate electrode contact portions 114a, 114b, 115a, and 115b, to thereby direct vertical access to underlying gate electrode end portions 114a, 114b, 115a, and 115b without interference from the upper gate electrode end portions 154a, 154b, 155a, and 155b.

After siliciding of gate electrodes 154 and 155, source regions 156a and 156b, and drain region 158; an oxide insulation layer 170 is then formed over the second layer gate array structure. Oxide layer 70 is formed to an average thickness of from about 0.5 micrometers (microns) to about 1.5 μm (microns), preferably about 1 μm. Formation of oxide layer 170 over silicided surfaces 164, 165, 166a, 166b, and 168 respectively on gate electrodes 154, 155, source regions 156a and 156b, and drain region 158, as shown in FIG. 22, completes the formation of this embodiment of the two level gate array MOS structure of the invention.

The completed two level gate array structure of this embodiment of the invention may later be customized, as is well known to those skilled in the art, by the provision of appropriate contact openings through the respective oxide insulation layers to interconnect certain of the source and drain regions, and gate electrode contact regions to overlying metal lines subsequently formed over oxide layer 170 to provide the particular desired electronic circuitry, as shown in FIGS. 21–24.

Figure 21:
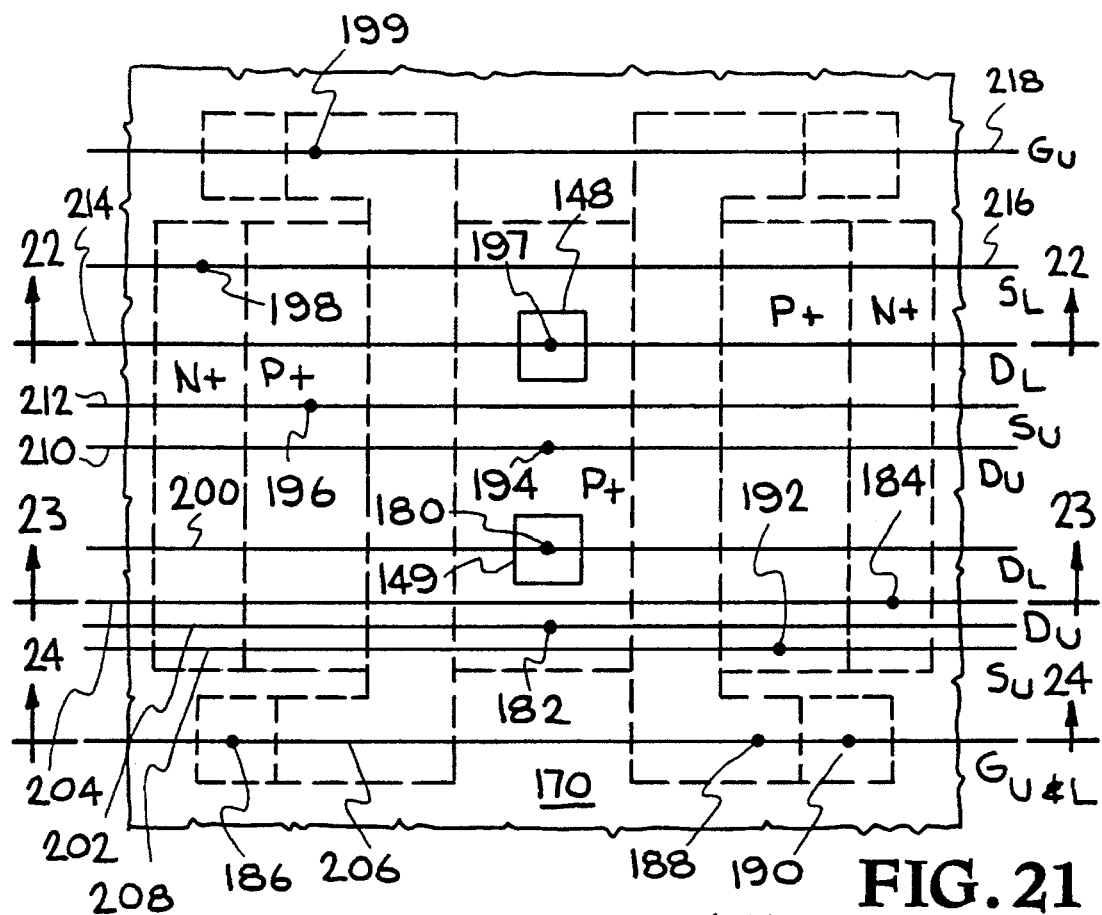
FIG. 21 is a fragmentary top view of the second embodiment of the multilevel gate array integrated circuit structure of the invention, showing metal lines connected to the various source and drain regions, and gate electrode contact regions through contact openings.

FIG. 21 illustrates the provision of a number of parallel metal lines 200–218 over oxide layer 170, each of which is connected, through a contact opening extending perpendicularly to the plane of substrate 102, to one or more source regions, drain regions, or gate electrode contact regions of the two level gate array structure of the invention.

Figure 22:
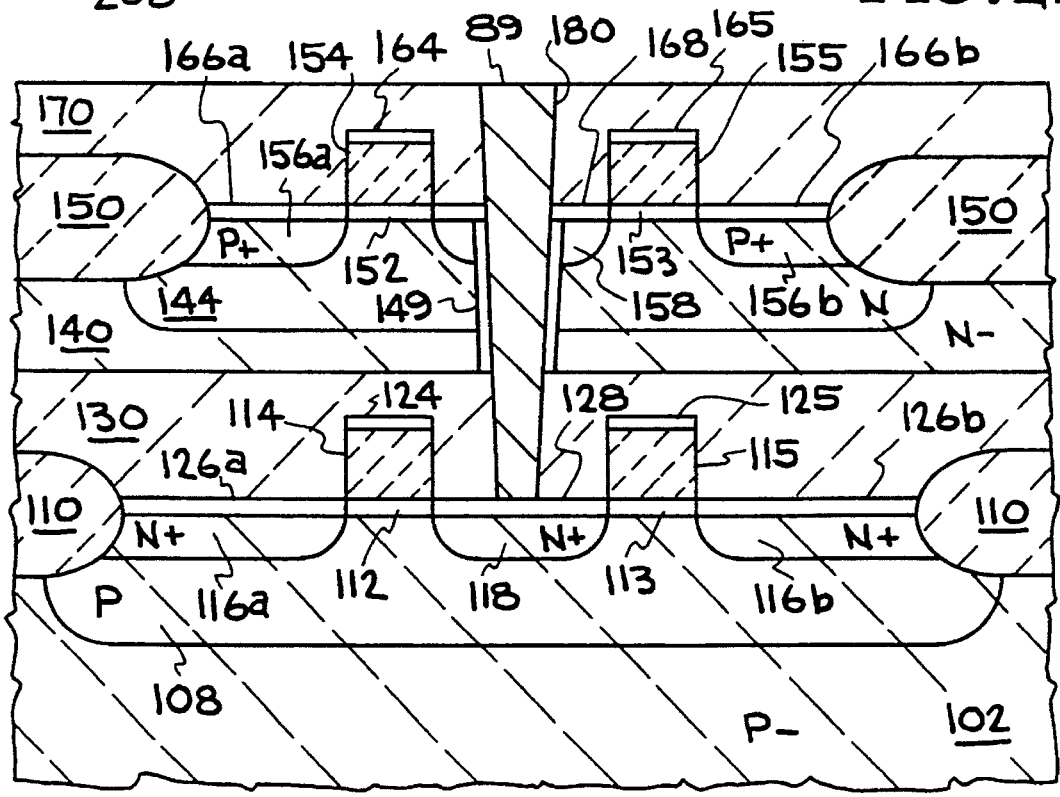
FIG. 22 is a fragmentary vertical side section view of the structure of FIG. 21 taken along lines 22—22 showing the provision of direct access to the underlying drain region in the lower level of the gate array through a contact opening disposed perpendicular to the plane of the underlying substrate.

As seen in FIGS. 21 and 22, a contact opening 180 is formed through oxide layer 170, oxide region 149, and oxide 130 to common lower drain region 118. Contact opening 180 is filled with conductive material 89 to provide an electrical connection between silicide 128 and metal line 200 over oxide layer 170.

Figure 23:
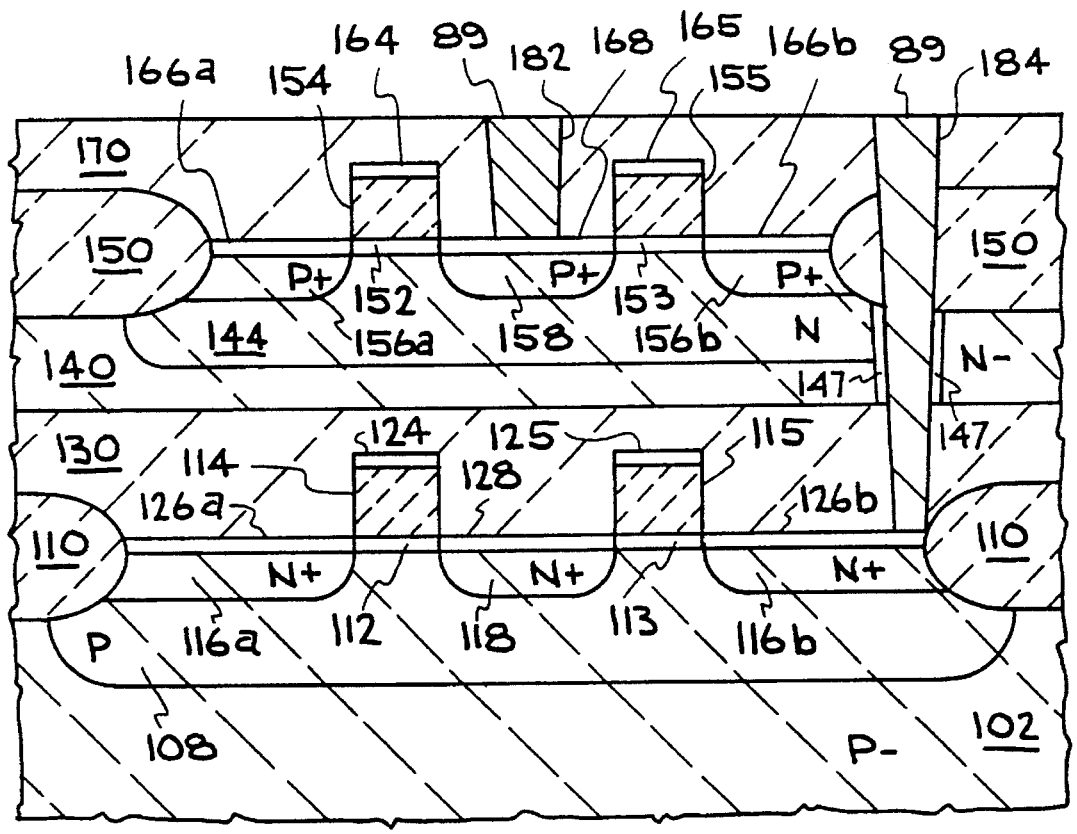
FIG. 23 is a fragmentary vertical side section view of the structure of FIG. 21 taken along lines 23—23 showing the provision of direct access to one of the underlying source regions in the lower level of the gate array and to the underlying drain region in the upper level of the gate array through contact openings disposed perpendicular to the plane of the underlying substrate.

Referring to FIGS. 21 and 23, contact opening 182 is shown extending through oxide layer 170 to common upper drain region 158 and is filled with conductive material 89 to provide electrical connection between silicide 168 and metal line 202 on oxide layer 170. Contact opening 184 is shown extending through oxide layer 170, field oxide 150, oxide 147, and oxide layer 130 to lower source region 116b. Filling of contact opening 184 with conductive filler material 89 results in an electrical connection between silicide 126b and metal line 204 on oxide layer 170.

Figure 24:
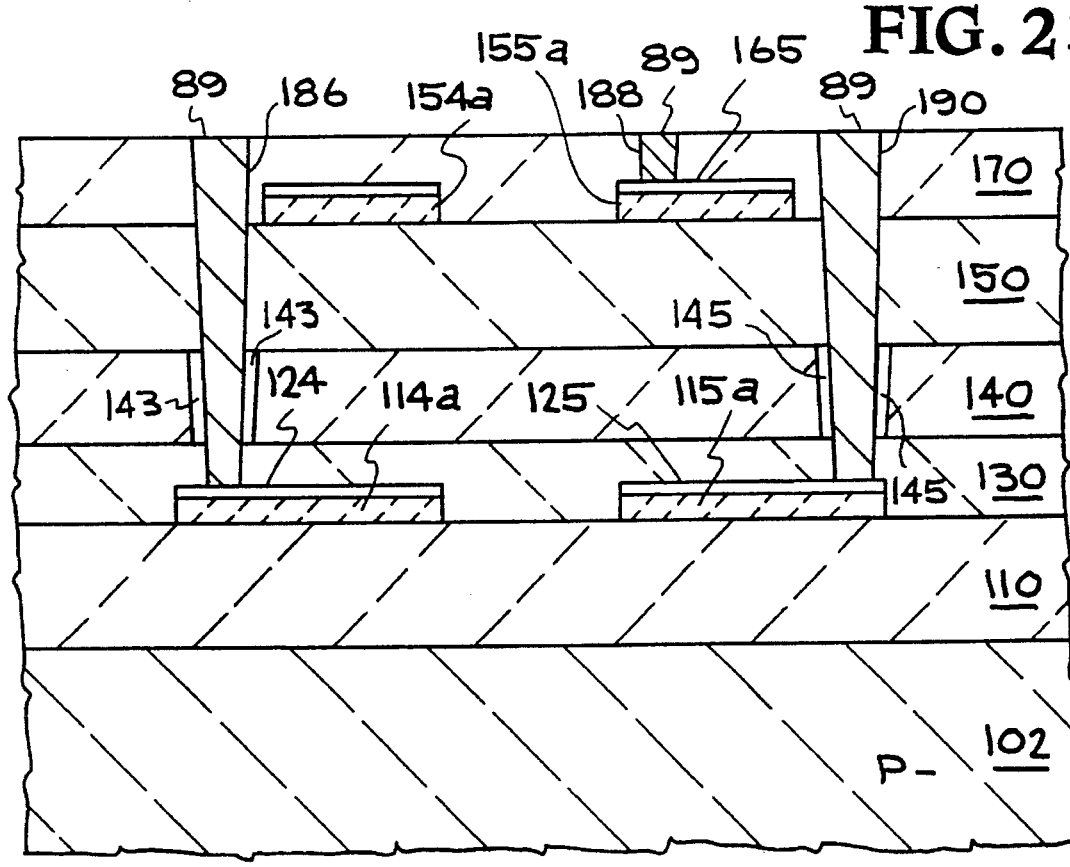
FIG. 24 is a fragmentary vertical side section view of the structure of FIG. 21 taken along lines 24—24 showing the provision of direct access to underlying gate electrode contact regions in both levels of the gate array through contact openings disposed perpendicular to the plane of the underlying substrate.

In FIGS. 21 and 24, connection between various gate electrodes and metal lines are illustrated. Contact opening 186 extends through oxide layer 170, field oxide 150, oxide 143, and oxide layer 130 to reach lower gate electrode contact portion 114a and is filled with conductive filler material 89 to provide electrical connection between silicide 124 and metal line 206 on oxide layer 170. Contact opening 188 extends down through oxide layer 170 to reach upper gate electrode end portion 155a and is filled with conductive filler material 89 to provide electrical connection between silicide 165 and metal line 206 on oxide layer 170. Contact opening 190 extends down through oxide layer 170, field oxide 150, oxide 145, and oxide layer 130 to reach gate electrode end portion 115a and is filled with conductive filler material 89 to provide electrical connection between silicide 125 and metal line 206 on oxide layer 170.

Similarly, referring to FIG. 21, contact openings 192, 194, 196, 197, 198, and 199 respectively extend down from metal lines 208, 210, 212, 214, 216, and 218, and are filled with conductive filler material 89 to make direct vertical or perpendicular contact, respectively, with upper source region 156b, upper drain region 158, upper source region 156a, lower drain region 118, lower source region 116a, and upper gate electrode 154b.

It should be noted that whenever the contact opening passes through a non-oxide layer, e.g., contact opening 180 in FIG. 22, contact opening 184 in FIG. 23, and contact openings 186 and 190 in FIG. 24, the exposed non-oxide surfaces, e.g. silicon layer 140, is lined with an insulating sleeve, i.e., an oxide sleeve such as oxide 149 in FIG. 22, oxide 147 in FIG. 23, and oxide 143 and 145 in FIG. 24. Such oxide insulation may be either grown or formed by CVD. In the case of illustrated contact openings 184, 186, and 190, which pass through field oxide 150, the field oxide may be grown to a sufficient thickness to extend downward as far as underlying oxide layer 130, thereby eliminating the need for oxide insulation 143, 145, and 147.

Figure 25:
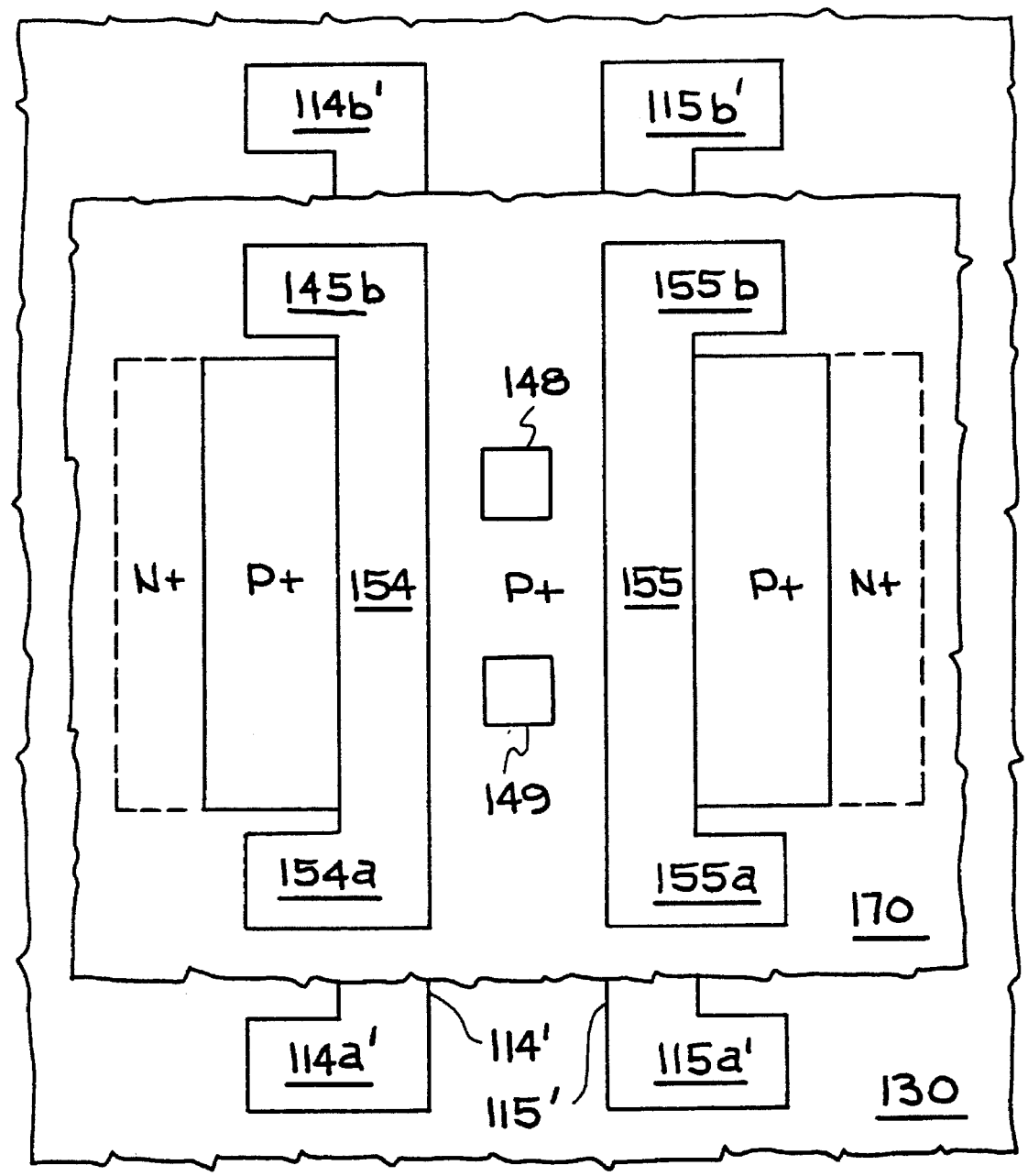
FIG. 25 is a fragmentary top view of another embodiment of the gate electrodes used in the lower level in the structure of the invention, with the gate electrode contact regions of the lower gate electrodes extending beyond the gate electrode contact regions of the upper level gate electrodes along the major axis of the gate electrodes.

Referring now to FIG. 25, an alternate embodiment of the lower gate electrodes is shown wherein lower gate electrode contact portions 114a', 114b', 115a', and 115b', are the same length, respectively, as upper gate electrode contact portions 154a, 154b, 155a, and 155b. However, in this embodiment lower gate electrodes 114' and 115', are longer than upper gate electrodes 154 and 155, thus causing lower gate electrode contact portions 114a', 114b', 115a', and 115b' to extend beyond respective upper gate electrode contact portions 154a, 154b, 155a, and 155b. This, in turn, permits the provision of an additional gate electrode metal line on each end of the array so that electrically independent vertical or perpendicular contact can be made with each of the upper and lower gate electrodes.

It should be noted however, that it is within the scope of the invention to provide a lateral interconnect or offset connection to provide a connection to lower drain region 118 wherein a first contact opening would be formed through oxide layer 130 to silicide contact 128 on drain region 118, a lateral interconnect would be formed over oxide layer 130, and a second, but offset, contact opening would then be optionally formed from the surface of oxide layer 170 down to the lateral interconnect if and when contact to drain region 118 would be desired for the particular circuitry.

Thus, the invention provides a novel multilevel gate array structure wherein multiple levels of active device regions, such as source regions, drain regions, and gate electrodes of MOS devices, may be independently accessed, after construction of the multilevel gate array structure of the invention, perpendicular to the plane of the substrate for subsequent customized formation of electrical circuits by interconnection of the respective active device regions, e.g., source, drain, and gate electrode contact regions, to metal lines to build such customized electrical circuits from the multiple levels of previously formed generic gate array structures.

Having thus described the invention what is claimed is:

1. A multilevel gate array integrated circuit structure wherein each region of each active device in the multilevel gate array integrated circuit structure is directly accessible normal to the plane of the underlying substrate comprising:
   a) a semiconductor substrate;
   b) a first level of active semiconductor devices formed in and on said semiconductor substrate, each of said active semiconductor devices of said first level having a plurality of semiconductor regions and at least one electrode region;
   c) a first insulation layer over said first level of semiconductor devices;
   d) at least one further semiconductor layer formed over said first insulation layer and having active semiconductor devices formed therein to comprise a second level of active semiconductor devices positioned to permit access, perpendicular to the plane of said substrate, to each of said semiconductor and electrode regions of each of said semiconductor devices formed in said first level of active semiconductor devices in said substrate, each of said active semiconductor devices of said second level having a plurality of semiconductor regions and at least one electrode region; and
   e) a second insulation layer formed over said second level of semiconductor devices;

whereby each of said semiconductor regions and said at least one electrode region of each active semiconductor device formed in each of said first level of semiconductor devices and said second level of semiconductor devices is directly accessible perpendicular to the plane of said substrate.

2. The multilevel gate array integrated circuit structure of claim 1 wherein said active devices comprise MOS devices, said semiconductor regions comprise source regions and drain regions, and said electrode regions comprise gate electrode regions.

3. The MOS-type multilevel gate array integrated circuit structure of claim 2 wherein said multilevel structure comprises two levels of active semiconductor devices.

4. A multilevel gate array MOS-type integrated circuit structure wherein each region of each active device in the integrated circuit structure is directly accessible normal to the plane of the underlying substrate comprising:
   a) a semiconductor substrate;
   b) a first semiconductor device level formed in and on said semiconductor substrate comprising one or more first source regions, one or more first drain regions, and one or more first gate electrode regions;
   c) a first insulation layer formed over said first semiconductor device level;
   d) a second semiconductor device level formed over said first semiconductor device level comprising:
      i) a second source region formed over one of said one or more first source regions and arranged to permit access, normal to the plane of said substrate, to said underlying first source region;
      ii) a second drain region formed over one of said one or more first drain regions and arranged to permit access, normal to the plane of said substrate, to said underlying first drain region; and
      iii) a second gate electrode region formed over one of said one or more first gate electrode regions and arranged to permit access, normal to the plane of said substrate, to said underlying first gate electrode region; and
   e) a second insulation layer formed over said second semiconductor device level;

whereby each of said source regions, drain regions, and gate electrode regions in both of said semiconductor device levels is directly accessible perpendicular to the plane of said substrate.

5. The multilevel gate array MOS-type integrated circuit structure of claim 4 wherein each of said one or more source regions in said first semiconductor device level is formed having at least one dimension selected from the group consisting of width and length larger than the same dimension in a corresponding second source region in said second semiconductor device level formed over said each of said one or more first source regions to thereby permit perpendicular access to each of said one or more first source regions formed in said first semiconductor device level.

6. The multilevel gate array MOS-type integrated circuit structure of claim 4 wherein each of said one or more drain regions in said first semiconductor device level is formed having at least one dimension selected from the group consisting of width and length larger than the same dimension in a corresponding second drain region in said second semiconductor device level formed over said each of said one or more first drain regions to thereby permit perpendicular access to each of said one or more first drain regions formed in said first semiconductor device level.

7. The multilevel gate array MOS-type integrated circuit structure of claim 4 wherein: said MOS active devices formed in said first semiconductor device level are formed in islands, and each of said islands of said first device level is laterally separated by insulation from other islands in the same level; and said MOS active devices formed in said second semiconductor device level are formed in islands, and each of said islands of said second device level is laterally separated by insulation from other islands in the same level.

8. The multilevel gate array MOS-type integrated circuit structure of claim 4 wherein one gate electrode region is formed in each island in each level.

9. The multilevel gate array MOS-type integrated circuit structure of claim 4 wherein two spaced apart gate electrode regions are formed in each island in each level.

10. A multilevel gate array MOS-type integrated circuit structure wherein each region of each active device in the integrated circuit structure is directly accessible normal to the plane of the underlying substrate comprising:
   a) a semiconductor substrate;
   b) a first semiconductor device level formed in and on said semiconductor substrate comprising one or more first source regions, one or more first drain regions, and one or more first gate electrode regions;
   c) a first insulation layer formed over said first semiconductor device level;
   d) a second semiconductor device level formed over said first semiconductor device level comprising:
      i) a second source region arranged to permit access, normal to the plane of said substrate, to an underlying one of said one or more first source regions;
      ii) a second drain region arranged to permit access, normal to the plane of said substrate, to an underlying one of said one or more first drain regions; and
      iii) a second gate electrode region arranged to permit access, normal to the plane of said substrate, to an underlying one of said one or more first gate electrode regions;
   e) a second insulation layer formed over said multilevel gate array integrated circuit structure; and
   f) contact openings formed in said second insulation layer normal to the plane of said substrate to one or more of:
      i) said source regions,
      ii) said drain regions, and
      iii) said gate electrode regions in each of said semiconductor device levels.

11. The multilevel gate array MOS-type integrated circuit structure of claim 10 wherein each of said one or more first source regions in said first semiconductor device level formed beneath a corresponding second source region is formed having at least one dimension selected from the group consisting of width and length larger than the same dimension in said corresponding second source region in said second semiconductor device level above said each of said one or more first source regions to thereby permit perpendicular access, through said first insulation layer, to each of said one or more first source regions formed in said first semiconductor device level.

12. The multilevel gate array MOS-type integrated circuit structure of claim 10 wherein a portion of each of said one or more first gate electrode regions in said first semiconductor device level formed beneath a corresponding second gate electrode region is formed in a location different than said corresponding second gate electrode region in said second semiconductor device level above said each of said one or more first gate electrode regions to thereby permit perpendicular access, through said first insulation layer, to each of said one or more first gate electrode regions formed in said first semiconductor device level.

13. The multilevel gate array MOS-type integrated circuit structure of claim 10 wherein each of said one or more first drain regions in said first semiconductor device level formed beneath a corresponding second drain region is formed having at least one dimension selected from the group consisting of width and length larger than the same dimension in said corresponding second drain region in said second semiconductor device level above said each of said one or more first drain region to thereby permit perpendicular access, through said first insulation layer, to each of said one or more first drain regions formed in said first semiconductor device level.

14. The multilevel gate array MOS-type integrated circuit structure of claim 10 wherein each of said one or more second drain regions in said second semiconductor device level is formed with one or more oxide islands therein to thereby permit perpendicular access, through said first insulation layer and through said one or more oxide islands, to each of said one or more first drain regions formed in said first semiconductor device level beneath a corresponding second drain region in said second semiconductor device level.

15. A multilevel gate array MOS-type integrated circuit structure wherein each region of each active device in the integrated circuit structure is directly accessible normal to the plane of the underlying substrate comprising:
   a) a semiconductor substrate;
   b) a first semiconductor device level formed in and on said semiconductor substrate comprising one or more first source regions, one or more first drain regions, and one or more first gate electrode regions;
   c) a first insulation layer formed over said first semiconductor device level;
   d) a second semiconductor device level formed over said first semiconductor device level comprising:
      i) a second source region formed over one of said one or more first source regions and arranged to permit access, normal to the plane of said substrate, to said one of said one or more of said first source regions;
      ii) a second drain region formed over one of said one or more first drain regions and arranged to permit access, normal to the plane of said substrate, to said one of said one or more of said first drain regions; and
      iii) a second gate electrode region formed over one of said one or more first gate electrode regions and arranged to permit access, normal to the plane of said substrate, to said one of said one or more of said first gate electrode regions, wherein a portion of each of said one or more first gate electrode regions in said first semiconductor device level is formed in a location different than the corresponding second gate electrode region in said second semiconductor device level above said each of said one or more first gate electrode regions to thereby permit direct perpendicular access through said first insulation layer to said each of said one or more first gate electrode regions formed in said first semiconductor device level; and e) a second insulation layer formed over said second semiconductor device level; whereby each of said source regions, drain regions, and gate electrode regions in both of said semiconductor device levels is directly accessible normal to the plane of said substrate.

16. A multilevel gate array MOS-type integrated circuit structure wherein each region of each active device in the integrated circuit structure is directly accessible normal to the plane of the underlying substrate comprising:

a) a semiconductor substrate;

b) a first semiconductor device level formed in and on said semiconductor substrate comprising one or more first source regions, one or more first drain regions, and one or more first gate electrode regions;

c) a first insulation layer formed over said first semiconductor device level; and d) a second semiconductor device level formed over said first semiconductor device level comprising:
  i) a second source region formed over one of said one or more first source regions and arranged to permit access, normal to the plane of said substrate, to said one of said one or more of said first source regions;
  ii) a second drain region formed over one of said one or more first drain regions and arranged to permit access, normal to the plane of said substrate, to said one of said one or more first drain regions, wherein said second drain region in said second semiconductor device level is formed with one or more oxide islands therein to thereby permit direct perpendicular access, through said first insulation layer and through said one or more oxide islands, to said one of said one or more first drain regions formed in said first semiconductor device level beneath said second drain region in said second semiconductor device level; and
  iii) a second gate electrode region formed over one of said one or more first gate electrode regions and arranged to permit access, normal to the plane of said substrate, to said one of said one or more first gate electrode regions;

whereby each of said source regions, drain regions, and gate electrode regions in both of said semiconductor device levels is directly accessible normal to the plane of said substrate.

17. A multilevel gate array MOS-type integrated circuit structure wherein each region of each active device in the integrated circuit structure is directly accessible normal to the plane of the underlying substrate comprising:

a) a semiconductor substrate;

b) a first semiconductor device level formed in and on said semiconductor substrate comprising first source regions, first drain regions, and first gate electrode regions;

c) a first insulation layer formed over said first semiconductor device level;

d) a second semiconductor device level formed over said first semiconductor device level comprising:
  i) a second source region formed over each of said first source regions and arranged to permit access, normal to the plane of said substrate, to said corresponding underlying first source region;
  ii) a second drain region formed over each of said first drain regions and arranged to permit access, normal to the plane of said substrate, to said corresponding underlying first drain region; and
  iii) a second gate electrode region formed over each of said first gate electrode regions and arranged to permit access, normal to the plane of said substrate, to said corresponding underlying first gate electrode region; and e) a second insulation layer formed over said second semiconductor device level;

whereby each of said source regions, drain regions, and gate electrode regions in both of said semiconductor device levels is directly accessible perpendicular to the plane of said substrate.

* * * * *

UNITED STATES PATENT AND TRADEMARK OFFICE
CERTIFICATE OF CORRECTION

PATENT NO.  : 5,612,552                          Page 1 of 2
DATED       : March 18, 1997
INVENTOR(S) : Alexander H. Owens It is certified that error appears in the above-indentified patent and that said Letters Patent is hereby corrected as shown below:

Col. 13, line 19, claim 8, change "4" to "7".

Col. 13, line 22, claim 9, change "4" to "7".

Col. 13, lines 54 and 55, claim 10, change indentation as follows:

"iii) said gate electrode regions in each of said semiconductor device levels."

Col. 15, lines 4-8, claim 15, change indentation as follows:

"e) a second insulation layer formed over said second semiconductor device level;

UNITED STATES PATENT AND TRADEMARK OFFICE
CERTIFICATE OF CORRECTION

PATENT NO. : 5,612,552
DATED : March 18, 1997
INVENTOR(S) : Alexander H. Owens

It is certified that error appears in the above-indentified patent and that said Letters Patent is hereby corrected as shown below:

whereby each of said source regions, drain regions, and gate electrode regions in both of said semiconductor device levels is directly accessible normal to the plane of said substrate."

Signed and Sealed this

Twentieth Day of May, 1997

Attest:

BRUCE LEHMAN

*Attesting Officer*    *Commissioner of Patents and Trademarks*